(12) United States Patent
Lee

(10) Patent No.: US 12,027,303 B2
(45) Date of Patent: Jul. 2, 2024

(54) LAMINATED DEVICE

(71) Applicant: MODA-INNOCHIPS CO., LTD., Ansan-Si (KR)

(72) Inventor: Myung Ho Lee, Ansan-Si (KR)

(73) Assignee: MODA-INNOCHIPS CO., LTD. (KR)

( * ) Notice: Subject to any disclaimer, the term of this patent is extended or adjusted under 35 U.S.C. 154(b) by 791 days.

(21) Appl. No.: 16/973,031

(22) PCT Filed: May 24, 2019

(86) PCT No.: PCT/KR2019/006286
§ 371 (c)(1),
(2) Date: Dec. 7, 2020

(87) PCT Pub. No.: WO2019/240402
PCT Pub. Date: Dec. 19, 2019

(65) Prior Publication Data
US 2021/0272750 A1    Sep. 2, 2021

(30) Foreign Application Priority Data
Jun. 12, 2018  (KR) .................. 10-2018-0067184

(51) Int. Cl.
*H01F 27/33*     (2006.01)
*H01F 17/00*     (2006.01)
(Continued)

(52) U.S. Cl.
CPC ......... *H01F 27/33* (2013.01); *H01F 17/0013* (2013.01); *H01F 27/343* (2013.01);
(Continued)

(58) Field of Classification Search
CPC .... H01F 27/33; H01F 17/0013; H01F 27/343; H01F 2017/002; H01F 2017/0093;
(Continued)

(56) References Cited

U.S. PATENT DOCUMENTS

2013/0141206 A1   6/2013   Lee et al.
2015/0280682 A1*  10/2015  Park ........................ H01F 27/24
                                                           361/220

FOREIGN PATENT DOCUMENTS

CN       1425183 A      6/2003
CN       1663120 A      8/2005
(Continued)

OTHER PUBLICATIONS

International Search Report for PCT/KR2019/006286 mailed Sep. 6, 2019.
(Continued)

*Primary Examiner* — Tuyen T Nguyen
(74) *Attorney, Agent, or Firm* — Renaissance IP Law Group LLP

(57) ABSTRACT

Provided is a laminated device. The laminated device includes: a laminate body where a plurality of sheets are laminated; a plurality of noise filter parts provided in the laminate body and each having at least one coil pattern; and a plurality of external electrodes provided outside the laminate body and connected to the plurality of noise filter parts, respectively. At least one of the plurality of noise filter parts has the number of coil patterns different from that of the rest.

13 Claims, 16 Drawing Sheets

(51) Int. Cl.
*H01F 27/34* (2006.01)
*H03H 1/00* (2006.01)

(52) U.S. Cl.
CPC ......... *H03H 1/00* (2013.01); *H01F 2017/002* (2013.01); *H01F 2017/0093* (2013.01); *H03H 2001/0085* (2013.01)

(58) Field of Classification Search
CPC ........... H01F 27/402; H01F 2017/0026; H01F 2017/0066; H01F 27/2804; H01F 27/2847; H01F 2027/2809; H03H 1/00; H03H 2001/0085; H03H 7/09; H03H 2001/0021; H01L 23/60
See application file for complete search history.

(56) References Cited

FOREIGN PATENT DOCUMENTS

| | | | |
|---|---|---|---|
| CN | 101652860 | A | 2/2010 |
| CN | 103310945 | A | 9/2013 |
| CN | 105846032 | A | 8/2016 |
| CN | 106685374 | A | 5/2017 |
| JP | H08237060 | A | 9/1996 |
| JP | 2011176165 | A | 9/2011 |
| JP | JR2017073475 | A * | 4/2017 |
| JP | 2018067559 | A | 4/2018 |
| KR | 20070061784 | A | 6/2007 |
| KR | 100876206 | B1 | 12/2008 |
| KR | 101554333 | B1 | 9/2015 |
| KR | 20160137374 | A | 11/2016 |
| KR | 20170038670 | A | 4/2017 |
| KR | 20170104366 | A | 9/2017 |
| KR | 20170104366 | A * | 9/2017 |
| TW | 201803083 | A | 1/2018 |

OTHER PUBLICATIONS

Written Opinion for PCT/KR2019/006286 mailed Sep. 6, 2019.
He, Xiao-hai et al., "Development of 1.2 MV high power DC generator", High Power Laser and Particle Beams, vol. 19, No. 5, pp. 835-840, May 2007.

* cited by examiner

100 : 101~110   200 : 210~270
2100 : 210, 240, 270, 300a
2200 : 220, 250, 300b
2300 : 230, 260, 300c

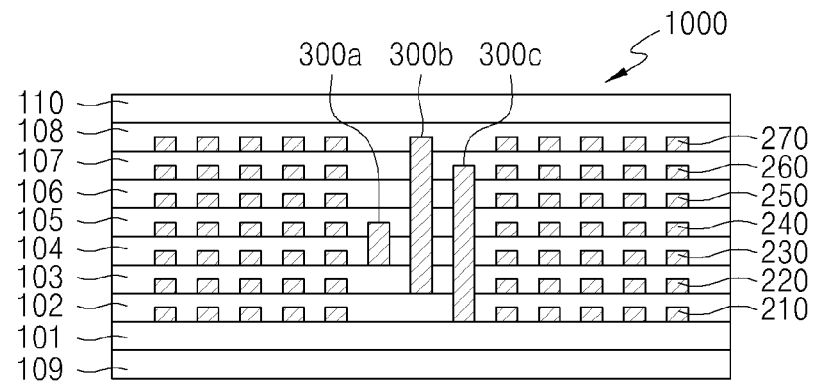
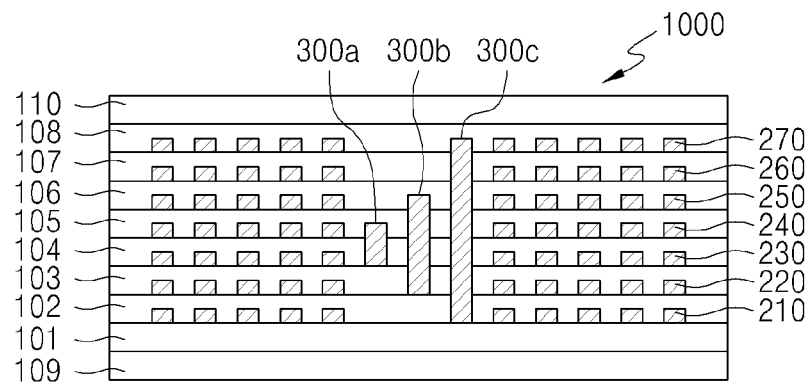

100 : 101~111    200 : 210~280
2100 : 220, 250, 280, 300a
2200 : 230, 260, 300b
2300 : 210, 240, 270, 300c

100 : 101~111    200 : 210~280
2100 : 210, 240, 260, 300a
2200 : 220, 270, 300b
2300 : 230, 250, 280, 300c

100 : 101~111   200 : 210~280
2100 : 220, 260, 300a
2200 : 230, 270, 300b
2300 : 210, 240, 250, 280, 300c

100 : 101~111   200 : 210~280
2100 : 210, 240, 250, 280, 300a
2200 : 220, 260, 300b
2300 : 230, 270, 300c

100 : 101~113    200 : 210~270
2100 : 210, 240, 270, 300a
2200 : 220, 250, 300b
2300 : 230, 260, 300c

100 : 101~111    200 : 210~280
2100 : 210, 240, 270, 300a
2200 : 220, 250, 300b
2300 : 230, 260, 300c

3100 : 3110, 3120, 3130
3200 : 3210, 3220, 3230
3300 : 3310, 3320
3000 : 3100, 3200, 3300

LAMINATED DEVICE

TECHNICAL FIELD

The present inventive concept relates to a laminated device, and more particularly, to a laminated device capable of eliminating common mode noise.

BACKGROUND ART

Conventional differential signaling uses two lines to transmit signals. However, recently, suggested is differential signaling using three lines capable of transmitting signals at the same speed while increasing the bandwidth. Differential signaling using three lines may be applied to the cameras, LCDs, and the like of smart phones. Existing differential signaling using two lines is called D-PHY and differential signaling using three lines is called C-PHY. Therefore, the C-PHY may reduce the number of signal transmission lines compared to the D-PHY. For example, in order to implement the 4K image on the LCD of the smartphone, 20 transmission lines are required for the conventional D-PHY, and if the C-PHY is used, transmission lines may be reduced to nine.

In the conventional differential signaling, two transmission lines are paired to transmit one signal, and in an ideal case, only differential signals with different phases of the signal should be present. However, depending on the state of the semiconductor chip set, which is the signal source, or the PCB, which is the body of the signal transmission line, and the state of the connector, it is difficult to maintain the out of phase between the perfect two signals. Since maintaining out of phase is more difficult as the system becomes more complicated and the transmission line becomes longer, especially, in a smart phone, a common mode component having the same signal phase is generated, and this signal acts as noise and affects the peripheral circuits. Especially, this affects wireless communication sensitivity that is sensitive to noise, and in the sensitive order, GPS, 800 MHz 2G/3G wireless communication, 1.8 GHz band, WiFi band, and so on are provided. In order to improve communication quality, a common mode noise filter for eliminating a common mode noise component is used, and may be mounted on an LCD, a camera, a USB, an external display, or the like, where a multimedia transmission line with a large data transmission amount is provided.

As the demand for high quality video and voice service increases as described above, a new C-PHY scheme is suggested, and as the three lines in a one pair rather than the existing two lines in one pair transmit signals, signal transmission becomes more complicated. Therefore, it is impossible to apply a filter that may remove generated noise to a conventional filter. That is, since the package itself of components must be changed according to the change of the number of lines, it is impossible to apply the existing filter in terms of external shape, and the internal circuit of the filter must also be changed so that noise may be removed while passing the correct signal.

Common mode noise is caused when voltage level of each signal is abnormal, delay occurs, or there is a difference in characteristic impedance of PCB, and the number of cases is large in correspondence to the various causes. For example, if a delay occurs in one of three signals, common mode noise occurs between the two signal lines, and if there are time delays in both signal lines or delays in three signal lines simultaneously, common mode noise occurs simultaneously in all three signal lines.

In order to eliminate this common-mode noise component, a conventional filter that may cope with only two signal lines is not enough. It is possible when using multiple elements but the cost is greatly increased and it is difficult to obtain a good effect such as an increase in the mounting area.

On the other hand, in the case of high-speed signal lines, it is also important to manage the size of the inductor's direct current resistance (RDC). But, when connecting multiple elements, the value is too high or an element with low DC resistance should be selected but it is difficult to find it. In the case of an element with a low DC resistance, the noise removal effect is often poor. Therefore, noise removal parts that satisfy various requirements become necessary, and as such a C-PHY filter, the inventor of the present inventive concept filed a Korean patent application No. 10-2016-0180228. In Korean Patent Application No. 10-2016-0180228, six coil patterns are formed in a laminate body in which a plurality of sheets are laminated, and two coil patterns are connected to form three noise filter parts.

The laminated device as the C-PHY filter is preferably matched to the impedance of the electronic device where the laminated device is mounted. If the impedance of the laminated device and the impedance of the electronic device are matched, a high-speed signal may be transmitted stably. However, if not matched, the signal may be lost and normal transmission may be difficult. Therefore, the laminated device is designed to match the impedance of the signal input terminal of the mounted electronic device.

However, when a laminated device where two noise patterns are connected to constitute three noise filter parts is designed once, it is difficult to control the impedance, and accordingly, it is difficult to adopt it to other electronic devices having different impedance characteristics.

Therefore, a laminated device whose impedance is relatively easy to be adjusted without changing the design is required.

PRIOR ART DOCUMENT

Patent Literature (Patent Document 1) Korean Patent No. 10-0876206 (Patent Document 2) Korean Patent Publication No. 10-2017-0104366

DISCLOSURE OF THE INVENTIVE CONCEPT

Technical Problem

The present inventive concept provides a laminated device that eliminates common mode noise occurring in three lines.

The present inventive concept provides a laminated device with easy impedance control.

Technical Solution

An embodiment of the inventive concept provides a laminated device including: a laminate body where a plurality of sheets are laminated; a plurality of noise filter parts provided in the laminate body and each having at least one coil pattern; and a plurality of external electrodes provided outside the laminate body and connected to the plurality of noise filter parts, respectively, wherein at least one of the plurality of noise filter parts has the number of coil patterns different from that of the rest.

In an embodiment, a smaller number of noise filter parts than the entire noise filter parts may have at least one impedance adjustment coil pattern.

In an embodiment, the impedance adjustment coil pattern may be formed on the outermost side of the coil pattern in the lamination direction of the sheet.

In an embodiment, an impedance may be adjusted according to at least one of the number of impedance adjustment coil patterns, the number of revolutions, and a line width.

In an embodiment, an impedance may be adjusted according to at least one of an interval between the impedance adjustment coil pattern and an adjacent coil pattern and a connection relationship between the impedance adjustment coil pattern and a coil pattern.

In an embodiment, in relation to at least one of the plurality of coil patterns, at least one of the number of revolutions of a coil pattern, a line width, and an interval between coil patterns may be different.

In an embodiment, an impedance may be adjusted according to at least one of the number of revolutions of the coil pattern, a line width, and an interval between the coil patterns.

In an embodiment, the laminated device may further include a magnetic core formed at the center of at least one coil pattern.

In an embodiment, the laminated device may further include at least one of at least one capacitor and overvoltage protection unit provided in the laminate body.

In an embodiment, a sheet where the noise filter part is formed may be a non-magnetic sheet, and a sheet where the overvoltage protection unit is formed may be a magnetic sheet.

In an embodiment, the laminated device may further include a surface modification member formed on at least a part of the surface of the laminate body and made of a material different from the surface of the laminate body.

In an embodiment, the external electrode may extend on at least one of the lowermost and uppermost sheets of the laminate body, and the surface modification member may be provided between an extended area of at least the external electrode and the laminate body.

In an embodiment, the laminated device may further include a floating coil pattern provided in the laminate body and not connected to another coil pattern and not connected to an external electrode.

Advantageous Effects

According to the present inventive concept, a plurality of coil patterns are formed in a laminate body in which a plurality of sheets are laminated, and at least two coil patterns are connected to each other to form one noise filter part. At least three such noise filter parts may be implemented in the laminate body. Also, in relation to fewer noise filter parts than the number of noise filter parts in the laminate body, for example, two or less noise filter parts among three or more noise filter parts, the number of coil patterns may be larger than the number of coil patterns of the remaining noise filter part. For example, three noise filter parts are provided in the laminate body. The two noise filter parts are formed by connecting two coil patterns in the vertical direction. One noise filter part may be formed by connecting three coil patterns in the vertical direction. That is, at least one noise filter part of the plurality of noise filter parts may further include an impedance adjustment coil pattern.

At least one noise filter part includes the impedance adjustment coil pattern to form more coil patterns compared to other noise filter parts, so the impedance may be adjusted. Also, by adjusting the number of impedance adjustment coil patterns, the number of revolutions, and the interval between the impedance adjustment coil pattern and other adjacent coil patterns, the impedance may be finely adjusted. The plurality of noise filter parts are provided on three signal lines by a plurality of external electrodes formed outside the laminate body. Therefore, it is possible to eliminate the common mode noise that occurs simultaneously in three signal lines and the common mode noise that occurs between the two signal lines, and accordingly, it may be applicable to the C-PHY.

Further, without changing the design of the plurality of coil patterns, impedance may be adjusted with only the design modifications of the impedance adjustment coil pattern such as the number of impedance adjustment coil patterns, the number of revolutions, intervals, and the like. Therefore, a laminated device that may be matched to various impedances of various electronic apparatuses may be manufactured with few design changes.

BRIEF DESCRIPTION OF THE DRAWINGS

FIGS. 5 and 6 are cross-sectional views of a laminated device according to a modification of the first embodiment of the present inventive concept;

DETAILED DESCRIPTION

Figure 1:
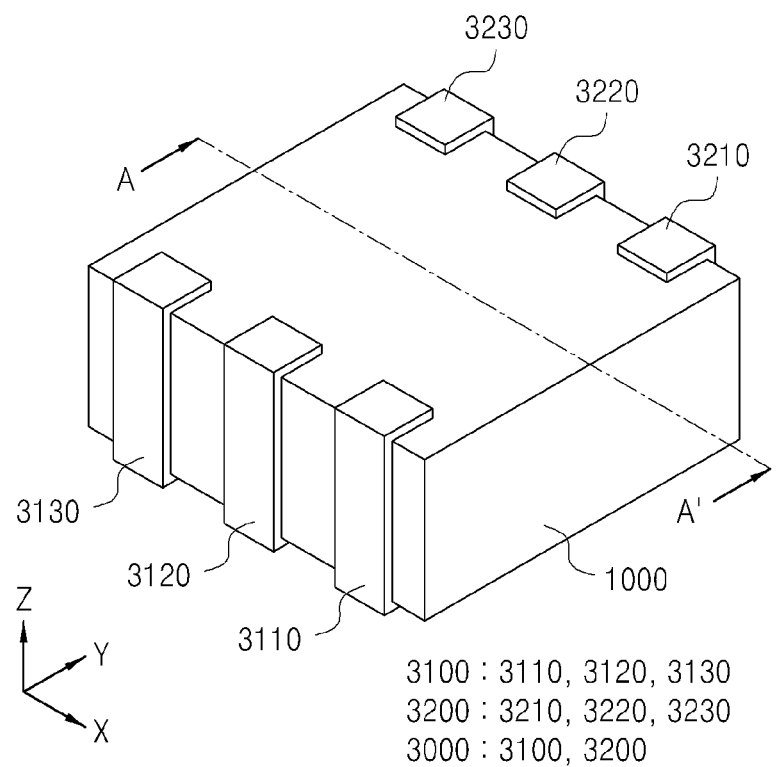
FIG. 1 is a view for explaining a laminated device according to a first embodiment of the present inventive concept.

Hereinafter, embodiments of the present inventive concept will be described in detail with reference to the accompanying drawings. However, the present inventive concept may be embodied in different forms and should not be construed as limited to the embodiments set forth herein, and rather, these embodiments are provided so that this disclosure will be thorough and complete, and will fully convey the scope of the present inventive concept to those skilled in the art. In the drawings, the thickness is enlarged to clearly illustrate the various layers and regions, and the same reference numerals denote the same elements in the drawings.

Figure 2:
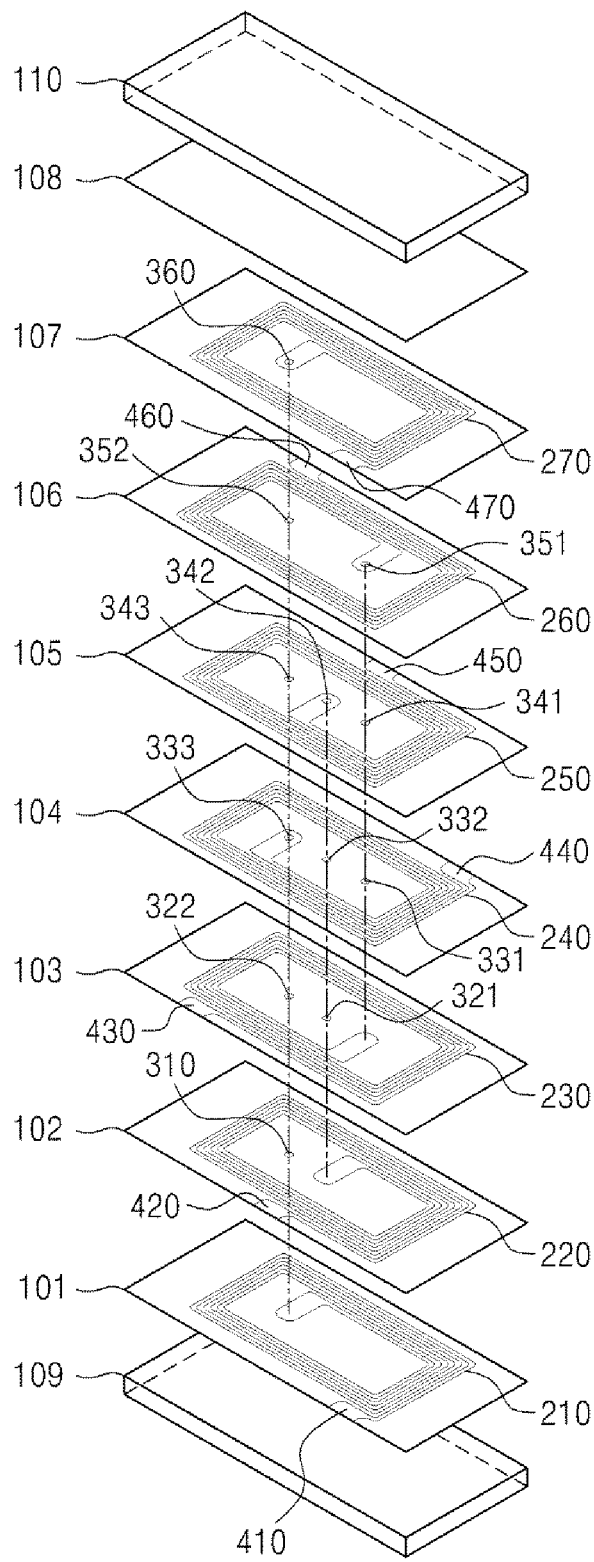
FIG. 2A is an exploded perspective view of a laminated device according to a first embodiment of the present invention.
FIG. 2B is an exploded perspective view of a laminated device according to another embodiment of the first embodiment of the present invention.
Figure 3:
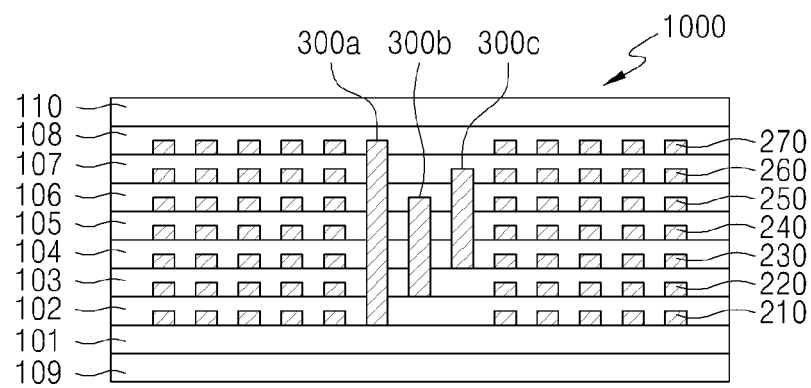
FIG. 3 is a cross-sectional view taken along line A-A' according to a first embodiment.
Figure 4:
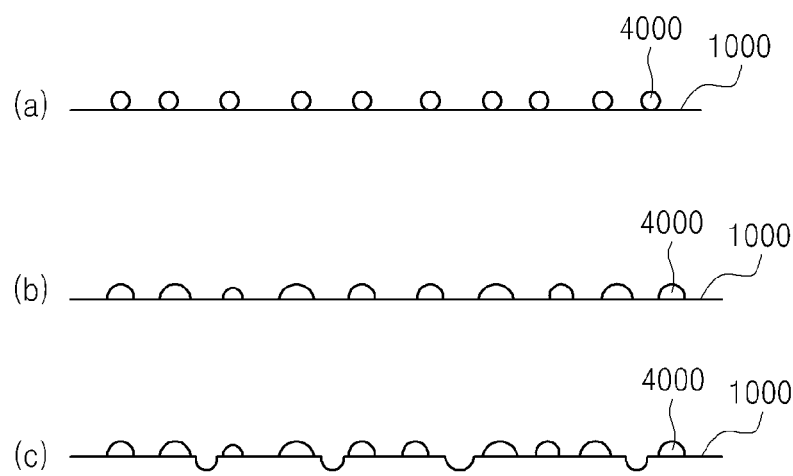
FIG. 4 is a schematic view of a laminate body surface.

FIG. 1 is a perspective view of a laminated device according to a first embodiment of the present invention. FIG. 2A is an exploded perspective view of a laminated device according to a first embodiment of the present invention, FIG. 2B is an exploded perspective view of a laminated device according to another embodiment of the first embodiment of the present invention. In addition, FIG. 3 is a cross-sectional view taken along line A-A' according to a first embodiment. FIG. 4 is a schematic view of a laminate body surface.

Referring to FIGS. 1 to 4, the laminated device according to the first embodiment of the present inventive concept may include a laminate body 1000 where a plurality of sheets 101 to 110 and 100 are laminated, at least three or more noise filter parts 2000 (2100, 2200, and 2300) including a plurality of coil patterns 200 (210 to 270) formed in the laminate body 1000, and external electrodes 3000 (3100 and 3200) provided outside the laminate body 1000 and connected to the noise filter part 2000. In addition, it may further include a surface modification member 4000 provided at least a part between the laminate body 1000 and the external electrode 3000. Here, the noise filter part 2000 may be provided in plurality, for example, three, and may be spaced a predetermined distance in the lamination direction of the sheets 100. That is, in relation to the laminated device according to an embodiment of the present inventive concept, at least three noise filter parts 2000 may be provided in the laminate body 1000, and the noise filter part 2000 may be connected to the external electrode 3000 and connected to the signal line through the external electrode 3000. Also, at least one of the noise filter part 2000 may be formed with the number of connected of coil patterns 200 different from the rest. For example, the first noise filter part 2100 may be formed by connecting three coil patterns, and the second and third noise filter parts 2200 and 2300 may be formed by connecting two coil patterns. As a specific example, the first noise filter part 2100 may be formed by connecting the first, fourth, and seventh coil patterns 210, 240, and 270, the second noise filter part 2200 may be formed by connecting the second and fifth coil patterns 220 and 250, and the third noise filter part 2300 may be formed by connecting the third and sixth coil patterns 230 and 260. At this time, as any one coil pattern, for example, the seventh coil pattern 270 is further connected to the first noise filter part 2100, the impedance of the laminated device may be controlled. That is, the seventh coil pattern 270 is a coil pattern for controlling the impedance of the laminated device. But, the noise filter part 2000 may be formed by connecting coil patterns in various shapes. In the present inventive concept, the number of connections of the coil patterns 200 of at least one noise filter part 2000 is different from the number of connections of the coil patterns 200 of the remaining noise filter part 2000. That is, according to the present inventive concept, one noise filter part 2000 is formed by at least one coil pattern 200 and is composed of a plurality of noise filter parts 2000, and in relation to a smaller number of noise filter parts 2000 than the total number of noise filter parts 2000, the number of connections of the coil pattern 200 is different from the number of connections of the coil pattern 200 of the remaining noise filter part 2000. In this case, the seventh coil pattern 270, that is, the impedance adjusting coil pattern, may be provided at the upper part of the sixth coil pattern 260 as described above but may be provided at any position between the second to sixth coil patterns 220 to 260. In particular, the seventh coil pattern 270 may be provided at a position adjacent to the third coil pattern 230. The first embodiment of the present inventive concept will be described in more detail as follows.

1. Laminate Body

The laminate body 1000 may have a substantially hexahedral shape. That is, the laminate body 1000 has a predetermined length and width in one direction (for example, X direction) and another direction (for example, Y direction) orthogonal to each other in the horizontal direction, and may be provided in a substantially hexahedral shape having a predetermined height in the vertical direction (e.g., the Z direction). Here, the length in the X direction may be equal to or different from the width in the Y direction, and the width in the Y direction may be equal to or different from the height in the Z direction. For example, the length and width may be the same or different, and the height may be different for the length. The ratio of length, width and height may be 1 to 5:1:0.2 to 2. That is, based on the width, the length may be about 1 to 5 times the width, and the height may be about 0.2 to 2 times the width. However, the size in the X, Y, and Z directions may be variously changed according to the internal structure of the electronic device to which the laminated device is connected, the shape of the laminated device, and the like.

The laminate body 1000 may be formed by laminating a plurality of sheets 100 (101 to 110). That is, the laminate body 1000 may be formed by laminating a plurality of sheets 100 having a predetermined length in the X direction, a predetermined width in the Y direction, and a predetermined thickness in the Z direction. Thus, the length and width of the laminate body 1000 may be determined by the length and width of the sheet 100, and the height of the laminate body 1000 may be determined by the number of laminated sheets 100. On the other hand, the plurality of sheets 100 may be a magnetic sheet or a non-magnetic sheet. That is, the plurality of sheets 100 may all be magnetic sheets or non-magnetic sheets. However, the plurality of sheets 100 may at least partially be a magnetic sheet, and the remainder may be non-magnetic sheets. For example, the sheets in which the noise filter part 2000 is implemented, that is, the first to eighth sheets 101 to 108, may be non-magnetic sheets, and the ninth and tenth sheets 109 and 110 may be a magnetic sheet. Here, the non-magnetic sheet may have a relative permittivity of 2 to 10, and the magnetic sheet may have a magnetic permeability of 2 to 1000 or a relative permittivity of 2 to 100. On the other hand, the magnetic sheet may be formed using, for example, NiZnCu or NiZn based magnetic ceramic. For example, the NiZnCu magnetic sheet may be formed by mixing $Fe_2O_3$, ZnO, NiO, and CuO, and $Fe_2O_3$, ZnO, NiO, and CuO may be mixed in a ratio of, for example, 5:2:2:1. In addition, non-magnetic sheets may be made using, for example, low temperature co-fired ceramics (LTCC). The LTCC material may include $Al_2O_3$, $SiO_2$, and a glass material.

The plurality of sheets 100 may be provided in a rectangular plate shape having a predetermined thickness. For example, they may be provided in the form of a square having the same length and width, and may be provided in the shape of a rectangular plate having a different length and width. In addition, the plurality of sheets 100 may all be formed to have the same thickness, and at least one of them may be formed thicker or thinner than the others. On the other hand, the plurality of sheets 100 may be formed to have a thickness of, for example, 1 μm to 4000 μm and 3000 μm or less. That is, the thickness of each of the sheets 100 may be 1 μm to 4000 μm according to the thickness of the laminate body 1000, for example, 1 μm to 300 μm, and preferably 5 μm to 100 μm. The interval between adjacent coil patterns 200 may be adjusted according to the thickness of each of the sheets 100. That is, the interval between the coil patterns 200 may be adjusted according to the thickness of the sheet 100. At this time, the differential impedance may be adjusted according to the interval between the coil patterns 200, that is, the thickness of each of the sheets 100. That is, as the interval between the coil patterns 200 becomes smaller, that is, as the thickness of each of the sheets 100 becomes thinner, the differential impedance may be lowered. As the interval between the coil patterns 200 becomes wider, that is, as the thickness of each of the sheets 100 becomes thicker, the differential impedance may be increased. However, the thickness of the sheet 100 and the number of layers may be adjusted according to the size of the laminated device. That is, when applied to a thin or small-sized laminated device, the sheet 100 may be formed to have a thin thickness, and when applied to a thick or large-sized laminated device, the sheet 100 may be formed to have a large thickness. Further, when the sheets 100 are laminated in the same number, the size of the laminated device is small so that as the height is lower, the thickness is thinner. As the size of the laminated device becomes larger, the thickness may be thick. Of course, thin sheets may also be applied to large-sizes laminated devices, and in this case, the number of laminated sheets increases.

In addition, the laminate body 1000 may further include a cover layer (not shown) provided on at least one of the lower part and the upper part. That is, the laminate body 1000 may include a cover layer provided on each of the lowermost layer and the uppermost layer. At this time, the cover layer may be provided only at the upper part or the lower part, or may be provided at both the upper part and the lower part. Of course, without a separate cover layer, the lowermost sheet, that is, the ninth sheet 109, may function as a lower part cover layer, and the uppermost sheet, that is, the tenth sheet 110, may function as an upper part cover layer. The ninth and tenth sheets 109 and 110 functioning as the lower part and upper part cover layers may be thicker than each of the sheets 101 to 108 therebetween. At this time, the ninth and tenth sheets 109 and 110, that is, the cover layer, may be formed by laminating a plurality of sheets having the same thickness as the sheets 101 to 108. Further, the ninth and tenth sheets 109 and 110 may be formed to have different thicknesses, and for example, the tenth sheet 110 may be thicker than the ninth sheet 109. Herein, the ninth and tenth sheets 109 and 110 may be formed of a magnetic sheet, and may be formed by laminating at least two magnetic sheet sheets. On the other hand, a glassy layer may be formed on at least one surface of the laminate body 1000. For example, a glassy sheet may be formed on either the lower surface of the ninth sheet 109 or the upper surface of the tenth sheet 110.

2. Noise Filter Part

The noise filter part 2000 may include a plurality of coil patterns 200 (210 to 270) selectively formed on the plurality of sheets 100, vertical connection wirings 300a, 300b, and 300c that have holes 300 (310 to 360) vertically connecting at least two coil patterns 200 and filled with a conductive material, and drawing electrodes 400 (410 to 470) drawn out from the coil pattern 200 so as to be exposed to the outside of the sheet 100. That is, coil patterns 200 (210 to 270) are formed on the upper part of the plurality of sheets 100, and at least two coil patterns 200 in the lamination direction of the sheet 100, that is, in the vertical direction, are connected through the holes 300 (310 to 360) filled with the conductive material, that is, the vertical connection wirings 300a, 300b and 300c. Thus, two or three coil patterns 200 connected in the vertical direction form each one noise filter part 2000, and three noise filter parts 2000 (2100, 2200, and 2300) are vertically laminated. That is, at least three noise filter parts 2000 are formed in the lamination direction of the sheets 100. Here, the noise filter part 2000 includes a common mode noise filter that removes common mode noise. Further, at least three noise filter parts 2000 are connected to the external electrode 3000 outside the laminate body 1000.

A first coil pattern 210 and a first drawing electrode 410 are formed on the first sheet 101. A second coil pattern 220, a hole 310 filled with a conductive material, and a second drawing electrode 420 are formed on a second sheet 102 provided on the upper side of the first sheet 101. A third coil pattern 230, holes 320 (321 and 322) filled with a plurality of conductive materials spaced apart from each other, and a third drawing electrode 430 are formed on the third sheet 230 provided on the upper side of the second sheet 102. A fourth coil pattern 240, holes 330 (331, 332, and 333) filled with a plurality of conductive materials spaced apart from each other, and a fourth drawing electrode 440 are formed on the fourth sheet 104 provided on the upper side of the third sheet 103. A fifth coil pattern 250, holes 340 (341, 342, and 343) filled with a plurality of conductive materials spaced apart from each other, and a fifth drawing electrode 450 are formed on the fifth sheet 105 provided on the upper side of the fourth sheet 104. A sixth coil pattern 260, holes 350 (351 and 352) filled with a plurality of conductive materials spaced apart from each other, and a sixth drawing electrode 460 are formed on the sixth sheet 106 provided on the upper side of the fifth sheet 105. A seventh coil pattern 270, a hole 360 filled with a conductive material, and a seventh drawing electrode 470 are formed on a seventh sheet 107 provided on the upper side of the sixth sheet 106.

Each of the first to seventh coil patterns 200 (210 to 270) may be formed in a predetermined number of turns by rotating in one direction from the central area of each of the first to seventh sheets 101 to 107. The first coil pattern 210 may be formed by rotating in one direction from an area corresponding to the hole 310 of the second sheet 102, and the second coil pattern 220 may be formed by rotating in one direction from an area spaced apart from the hole 310 by a predetermined interval and corresponding to the hole 321 of the third sheet 103. Moreover, the third coil pattern 230 may be formed by rotating in one direction from an area spaced a predetermined interval apart from the holes 321 and 322 spaced apart from each other and corresponding to the hole 331 of the fourth sheet 104, and the fourth coil pattern 240 may be formed by rotating in one direction from a hole 333 formed in an area corresponding to the hole 310 of the second sheet 102 and the hole 322 of the third sheet 103. Then, the fifth coil pattern 250 may be formed by rotating in one direction from the hole 342 formed in an area corresponding to the hole 332 of the fourth sheet 104, and the sixth coil pattern 260 may be formed by rotating in one direction from the hole 351 to be formed in an area corresponding to the hole 341 of the fifth sheet 105. In addition, the seventh coil pattern 270 may be formed by rotating in one direction from a hole 360 formed in an area corresponding to the hole 352 of the sixth sheet 106.

In addition, the coil pattern 200 may be formed at a predetermined number of revolutions, and may be formed at a number of revolutions of 2 to 20. At this time, at least one of the number of revolutions of the coil pattern 200 may be different, and for example, the first, third and fifth coil patterns 210, 230 and 250 are formed at the number of revolutions of 3 to 20, and the second, fourth, and sixth coil patterns 220, 240, and 260 may be formed at the number of revolutions of 2.5 to 18. That is, if the number of revolutions of the first, third and fifth coil patterns 210, 230 and 250 may be equal to or greater than the number of revolutions of the second, fourth and sixth coil patterns 220, 240 and 260. The seventh coil pattern 270 may be formed of the same number of revolutions as the odd-numbered coil patterns 210, 230, and 250, and may be formed of the same number of revolutions as the even-numbered coil patterns 220, 240, and 260. However, the seventh coil pattern 270 may be formed of the number of revolutions different from the odd-numbered coil patterns 210, 230, and 250 and the even-numbered coil patterns 220, 240, and 260. Here, the impedance of the laminated device may be controlled by adjusting the impedance adjustment coil pattern, that is, the number of revolutions of the seventh coil pattern 270. The reason for the change in the impedance of the laminated device is due to the mismatch between the impedance adjustment coil patterns disposed in parallel with the first to sixth coil patterns 210 to 260, that is, the seventh coil patterns 270. Therefore, as the number of revolutions of the impedance adjustment coil pattern is reduced, the impedance increases. That is, as the mismatch section of the impedance adjustment coil pattern and the remaining coil pattern becomes longer, the impedance changes rapidly. In other words, as the number of revolutions of the impedance adjustment coil pattern decreases, the impedance changes rapidly. At this time, if the number of revolutions of the impedance adjustment coil pattern changes, it has an intermediate impedance characteristic between when there is no impedance adjustment coil pattern and when there is an impedance coil pattern of the number of revolutions equal to the rest of the coil pattern. In addition, the impedance of the laminated device may be controlled according to the interval between the impedance adjustment coil pattern, that is, the seventh coil pattern 270, and the coil pattern adjacent to the lower side thereof, that is, the sixth coil pattern 260. For example, as compared to a case where the intervals between the first to seventh coil patterns 210 to 270 are the same, that is, the thicknesses of the first to seventh sheets 101 to 107 are the same, when the interval between the sixth coil pattern 260 and the seventh coil pattern 270 is wide, that is, the thickness of the seventh sheet 107 is thicker than the thicknesses of the first to sixth sheets 101 to 106, the coupling between the coil patterns is reduced and the impedance is increased. Conversely, if the interval between the sixth coil pattern 260 and the seventh coil pattern 270 is narrow, that is, the seventh sheet 107 is thinner than the first to sixth sheets 101 to 106, the coupling between the coil patterns increases so that the impedance decreases.

Also, the coil pattern 200 may have a predetermined line width and interval, and may be formed in a spiral shape that rotates outward in at least one of counterclockwise and clockwise directions. At this time, the line widths of the coil patterns 200 may be the same or different, and the intervals may be the same or different. That is, the line interval of the same coil pattern 200 may be different according to the number of revolutions of the coil pattern 200. Further, the coil pattern 200 may be formed with a line width of 5 μm to 50 μm. At this time, the impedance may be adjusted according to the line width and the interval of the coil pattern 200. That is, as the line width of the coil pattern 200 becomes narrower, the impedance increases, and as the line width increases, the impedance decreases. That is, as the interval of the coil pattern 200 becomes narrower, the impedance decreases, and as the interval becomes wider, the impedance increases. On the other hand, the rotation direction of the coil pattern 200 may be different. For example, the first, second and third coil patterns 210, 220 and 230 may rotate clockwise, and the fourth, fifth, sixth, and seventh coil patterns 240, 250, 260, and 270 may rotate counterclockwise. However, all of the coil patterns 200 may rotate in the same direction of clockwise or counterclockwise, and at least one of the coil patterns 200 may rotate in the other direction. Meanwhile, the coil pattern 200 may be formed in various shapes such as a straight line and a curved shape in addition to the spiral shape. That is, in the noise filter part 2000 of the present invention, a plurality of conductive patterns may be vertically connected. At least one of the plurality of conductive patterns may have a spiral shape, and at least the other may have a shape other than a spiral shape. Further, referring to FIG. 2B, a magnetic core (600: 601~607) structure may be formed inside the at least one coil pattern 200. That is, the magnetic material may be filled in the central part of the sheet 100 to form a magnetic core (600: 601~607), and the coil pattern 200 may be formed to surround the magnetic core (600: 601~607). At this time, the hole 300 filled with the conductive material may be formed on the outer side of the magnetic core (600: 601~607). That is, the hole 300 filled with the conductive material may be formed on the outer side of the magnetic core (600: 601~607) so that the plurality of coil patterns 200 surround the magnetic core (600: 601~607).

Meanwhile, the coil pattern 200 may be connected to drawing electrodes 400 (410 to 470) drawn in the outer side direction of the sheet 100. The first drawing electrode 410 connected to the first coil pattern 210 is formed to be exposed to a predetermined area of one long side of the first sheet 101. The second drawing electrode 420 connected to the second coil pattern 220 is formed to be exposed to one long side of the second sheet 102 and formed spaced apart from the first drawing electrode 410. The third drawing electrode 430 connected to the third coil pattern 230 is formed to be exposed to one long side of the third sheet 103 and formed spaced apart from the first and second drawing electrodes 410 and 420. The fourth drawing electrode 440 connected to the fourth coil pattern 240 is formed to be exposed to the other long side of the fourth sheet 104 and formed to be exposed to an area corresponding to the first drawing electrode 410. The fifth drawing electrode 450 connected to the fifth coil pattern 250 is formed to be exposed to the other long side of the fifth sheet 105 and formed spaced apart from the fourth drawing electrode 440 and corresponding to the second drawing electrode 420. The sixth drawing electrode 460 connected to the sixth coil pattern 260 is formed to be exposed to the other long side of the sixth sheet 106 and formed spaced apart from the fourth and fifth drawing electrodes 440 and 450 and corresponding to the third drawing electrode 430. The seventh drawing electrode 470 connected to the seventh coil pattern 270 is formed to be exposed to one long side of the seventh sheet 107 and formed overlapping with the first drawing electrode 410. Meanwhile, the drawing electrode 400 is formed to have a width larger than the width of the coil pattern 200 and may be formed to have a width that is narrower or equal to the width of the external electrode 3000. As the width of the drawing electrode 400 is formed to be wider than the width of the coil pattern 200, the contact area with the external electrode 3000 may be increased, and accordingly, this may reduce the contact resistance between the drawing electrode 400 and the external electrode 3000.

As shown in FIGS. 2A, 2B and 3, the first, fourth, and seventh coil patterns 210, 240, and 270 are connected through a vertical connection wiring 300a to form a first noise filter part 2100. That is, the seventh coil pattern 270 is connected to the fourth coil pattern 240 through a hole 360 filled with a conductive material formed on the seventh sheet 107, a hole 352 filled with a conductive material formed on the sixth sheet 106, and a hole 343 filled with a conductive material formed on the fifth sheet 105. The fourth coil pattern 240 is connected to the first coil pattern 210 through a hole 333 filled with a conductive material formed on the fourth sheet 104, a hole 322 filled with a conductive material formed on the third sheet 103, and a hole 310 filled with a conductive material formed on the second sheet 102. The second and fifth coil patterns 220 and 250 are connected through a vertical connection wiring 300b to form a second noise filter part 2200. That is, the fifth coil pattern 250 is connected to the second coil pattern 220 through a hole 342 filled with a conductive material formed on the fifth sheet 105, a hole 332 filled with a conductive material formed on the fourth sheet 104, and a hole 321 filled with the conductive material formed on the third sheet 103. Then, the third and sixth coil patterns 230 and 260 are connected to each other through a vertical connection wiring 300c to form a third noise filter part 2300. That is, the sixth coil pattern 260 is connected to the third coil pattern 230 through a hole 351 filled with a conductive material formed on the sixth sheet 106, a hole 341 filled with a conductive material formed on the fifth sheet 105, and a hole 331 filled with the conductive material formed on the fourth sheet 104. However, the connection method of the coil patterns spaced apart from each other may be variously modified.

In addition, the first drawing electrode 410 connected to the first coil pattern 210 is connected to the 1-1 external electrode 3110, and the fourth drawing electrode 440 connected to the fourth coil pattern 240 is connected to the 2-1 external electrode 3210. In addition, the second drawing electrode 420 connected to the second coil pattern 220 is connected to the 1-2 external electrode 3120, and the fourth drawing electrode 450 connected to the fifth coil pattern 250 is connected to the 2-2 external electrode 3220. In addition, the third drawing electrode 430 connected to the third coil pattern 230 is connected to the 1-3 external electrode 3130, and the sixth drawing electrode 460 connected to the sixth coil pattern 260 is connected to the 2-3 external electrode 3230. Then, the seventh drawing electrode 470 connected to the seventh coil pattern 270 is connected to the 1-1 external electrode 3110 together with the first drawing electrode 410. Thus, the first noise filter part 2100 is connected between the 1-1 and 2-1 external electrodes 3110 and 3210. The second noise filter part 2200 is connected between the 1-2 and 2-2 external electrodes 3120 and 3220. The third noise filter 2300 is connected between the 1-3 and 2-3 external electrodes 3130 and 3230.

Meanwhile, the number of revolutions of the coil pattern 200 constituting the first to third noise filter parts 2100, 2200 and 2300 may be the same or different from each other. As the number of revolutions of the coil pattern 200 constituting the noise filter part 2000 are different from each other, one laminated device may have at least two impedance characteristics. Also, the coil pattern 200 and the drawing electrode 400 formed on the plurality of sheets 100 according to an embodiment of the present inventive concept may be formed of a conductive material such as a metal. Here, the coil pattern 200 and the drawing electrode 400 may be formed by a plating process, a printing process, a deposition process, or the like. For example, the coil pattern 200 and the drawing electrode 400 may be formed by a copper plating process, and at least a portion of the external electrode 3000 connected to the drawing electrode 400 may be formed by a copper plating process. That is, the drawing electrode 400 and at least a part of the external electrode 3000 contacting the same may be formed of the same material and through the same process.

As described above, in relation to the laminated device of the present inventive concept, the number of connections of the coil pattern 200 of at least one noise filter part 2000 among the plurality of noise filter parts 2000 may be greater than the number of connections of the coil patterns 200 of the remaining noise filter part 2000. For example, the first noise filter part 2100 may be formed by connecting three coil patterns 210, 240, and 270, and the second and third noise filter parts 2200 and 2300 may be formed by connecting two coil patterns. As the number of connections of the coil patterns connected to the first noise filter part 2100 is larger than the number of connections of the coil patterns of the second and third noise filter parts 2200 and 2300, the impedance of the laminated device may be controlled. That is, as at least one noise filter part 2100 further includes an impedance adjustment coil pattern, the impedance may be improved compared to a structure without an impedance adjustment coil pattern. However, the number of the connection coil patterns 200 of the noise filter part 2000 may be variously changed.

3. External Electrode

External electrodes 3000 may be provided on each of two side surfaces facing each other of the laminate body 1000. That is, when the lamination direction of the sheets 100 is referred to as the vertical direction (i.e., the Z direction), external electrodes 3000 may be formed on two side surfaces facing each other of the laminate body 1000 in the opposing horizontal direction (i.e., the Y direction) in the vertical direction of the laminate body 1000. In addition, three external electrodes 3000 may be provided on both side surfaces. In other words, for the three noise filter parts 2100, 2200, and 2300, two external electrodes 3000 may be formed on two side surfaces, respectively. At this time, the external electrodes 3110, 3120 and 3130 formed on one side surface of the laminate body 1000 are referred to as a first external electrode 3100, and the external electrodes 3210, 3220 and 3230 formed on the other side surface are referred to as a second external electrode 3200. The external electrode 3000 may be connected to the first to third noise filters 2100, 2200 and 2300 inside the laminate body 1000, and may be connected to one terminal and the other terminal, for example, a signal input terminal and a signal output terminal, outside the laminate body 1000.

The first and second external electrodes 3100 and 3200 may extend toward the upper part surface and the lower part surface of the laminate body 1000. That is, the first and second external electrodes 3100 and 3200 may extend toward two surfaces facing each other in the Z direction of the laminate body 1000, that is, an upper part surface and a lower part surface. Accordingly, the external electrode 3000 may extend from the side surface of the laminate body 1000 to the upper part surface and the lower part surface, and may be formed, for example, in a "⊏" shape. Of course, the external electrode 3000 may be formed on the side surface of the laminate body 1000 and on the side where the laminated device of the present inventive concept is mounted, for example, on the lower part surface, and may be formed in, for example, an "L" shape. That is, the external electrode 3000 may not extend to the upper part surface of the laminate body 1000 but may extend to the side surface and the lower part surface of the laminate body 1000.

On the other hand, the external electrode 3000 may be formed of at least one layer. The external electrode 3000 may be formed of a metal layer such as Ag, and at least one plating layer may be formed on the metal layer. For example, the external electrode 3000 may be formed by laminating a copper layer, a Ni plating layer, and a Sn or Sn/Ag plating layer. That is, the external electrode 3000 may be formed of a plurality of layers, and at least one layer formed on the surface of the laminate body 1000 and connected to the drawing electrode 400 may be formed of the same material and the same process as the drawing electrode 400. For example, the first layer that is in contact with the surface of the laminate body 1000 of the external electrode 3000 may be formed by copper plating like the coil pattern 200 and the drawing electrode 400. In such a manner, the first layer of the external electrode 3000 is formed of the same material and the same method as the coil pattern 200 and the drawing electrode 400, for example, copper plating, so that the coupling force between the external electrode 3000 and the drawing electrode 400 may be improved. In addition, the external electrode 3000 may be formed by mixing a multi-component glass frit containing, for example, 0.5% to 20% $Bi_2O_3$ or $SiO_2$ as a main component with a metal powder. At this time, a mixture of the glass frit and the metal powder may be prepared in the form of a paste and applied to two surfaces facing each other of the laminate body 1000. As the glass frit in the external electrode 3000 is included in such a manner, the adhesion of the external electrode 3000 and the laminate body 1000 may be improved, and the contact response between the drawing electrode 400 and the external electrode 3000 may be improved. In addition, after the conductive paste containing glass is applied, at least one plating layer may be formed on the upper part thereof to form the external electrode 3000. That is, the metal layer containing glass and at least one plating layer on the upper part thereof are formed so that the external electrode 3000 may be formed. For example, in relation to the external electrode 3000, after forming a layer containing at least one of glass frit and Ag and Cu, the Ni plating layer and the Sn plating layer may be sequentially formed through electrolytic or electroless plating. At this time, the Sn plating layer may be formed to have a thickness equal to or thicker than the Ni plating layer. On the other hand, the external electrode 3000 may be formed to have a thickness of 2 μm to 100 μm. A Ni plating layer may be formed to have a thickness of 1 μm to 10 μm. The Sn or Sn/Ag plating layer may be formed to have a thickness of 2 μm to 10 μm.

4. Surface Modification Member

A surface modification member 4000 may be formed on at least a portion of the surface of the laminate body 1000. That is, the surface modification member 4000 may be formed on the entire surface of the laminate body 1000 or only on an area contacting the external electrode 3000 of the laminate body 1000. In other words, in relation to the surface modification member 4000, a surface modification member 4000 formed on a part of the surface of the laminate body 1000 may be formed between the laminate body 1000 and the external electrode 3000. At this time, the surface modification member 4000 may be formed in contact with the extended area of the external electrode 3000. That is, the surface modification member 4000 may be provided between one area of the external electrode 3000 extending to the upper part surface and the lower part surface of the laminate body 1000 and the laminate body 1000. The surface modification member 4000 may be formed on the surface of the laminate body 1000 having a glassy layer formed on at least a part thereof or on the surface of the laminate body 1000 having no glassy layer formed thereon. Also, the surface modification member 4000 may be provided with the same or different size as the external electrode 3000 formed on the upper part thereof. For example, an area of 50% to 150% of the area of a portion of the external electrode 3000 extending to the upper part surface and the lower part surface of the laminate body 1000 may be formed. That is, the surface modification member 4000 may be formed to have a size smaller or larger than the size of the extended area of the external electrode 3000, or may be formed to have the same size. Of course, a surface modification member 4000 may also be formed between the external electrodes 3000 formed on the side surface of the laminate body 1000. This surface modification member 4000 may include a glass material. For example, the surface modification member 4000 may include non-borosilicate glass ($SiO_2$—CaO—ZnO—MgO glass) that may be fired at a predetermined temperature, for example, 950° C. or below. In addition, the surface modification member 4000 may further include a magnetic substance material. That is, if the area where the surface modification member 4000 is formed is composed of the magnetic sheet, in order to facilitate the bonding of the surface modification member 4000 and the magnetic sheet, a magnetic material may be included in the surface modification member 4000. At this time, the magnetic substance material includes, for example, a NiZnCu-based magnetic powder, and the magnetic substance material may be contained in an amount of, for example, 1 to 15 wt % with respect to 100 wt % of the glass material. On the other hand, at least a part of the surface modification member 4000 may be formed on the surface of the laminate body 1000. At this time, at least a part of the glass material may be uniformly distributed on the surface of the laminate body 1000 as shown in FIG. 4(*a*). Or as shown in FIG. 4 (*b*), the glass material may be at least partially irregularly distributed in different sizes. Of course, the surface modification member 4000 may be formed continuously on the surface of the laminate body 1000 to have a film shape. In addition, as shown in FIG. 4(*c*), at least a part of the surface of the laminate body 1000 may be provided with a recess part. That is, a glass material may be formed to form a convex part and at least a portion of an area where no glass material is formed may be formed to form a recess part. At this time, the glass material may be formed at a predetermined depth from the surface of the laminate body 1000, so that at least a part of the glass material may be formed higher than the surface of the laminate body 1000. That is, at least a portion of the surface modification member 4000 may be flush with the surface of the laminate body 1000, and at least a portion thereof may be maintained higher than the surface of the laminate body 1000. As the surface modification member 4000 is formed by distributing the glass material in a certain area of the laminate body 1000 before forming the external electrode 3000, it is possible to modify the surface of the laminate body 1000, thereby making the resistance of the surface uniform. Thus, it is possible to control the shape of the external electrode, thereby facilitating the formation of external electrodes. On the other hand, in order to form the surface modification member 4000 in a predetermined area of the surface of the laminate body 1000, the paste containing the glass material may be printed or applied to a predetermined area of the predetermined sheet. For example, a glass paste may be applied to the six areas of the lower surface of the eighth sheet 108 and the upper surface of the ninth sheet 109, and then cured to form a surface modification member 4000. In addition, the glass paste may be applied to a predetermined area of the ceramic green sheet before cutting it into the size of a laminated device. That is, after a glass paste is applied to a plurality of areas of the ceramic green sheet, a green sheet is cut with a cutting line of the laminated device unit, including the portion where the glass paste is formed, and this is laminated with a sheet where a noise filter part is formed to manufacture a laminated device. At this time, since the surface modification member 4000 is formed at the edge of the laminate body 1000, it may be cut into laminated device units around the area where the glass paste is applied.

On the other hand, the surface modification member 4000 may be formed using an oxide. That is, the surface modification member 4000 may be formed using at least one of a glassy material and an oxide, and may further include a magnetic substance material. At this time, in relation to the surface modification member 4000, oxides in a crystalline state or an amorphous state may be dispersed and distributed on the surface of the laminate body 1000, and at least a portion of the oxide distributed on the surface may be melted. At this time, in the case of the oxide, it may be formed as shown in FIGS. 4(a) to 4(c). Further, even when the surface modification member 4000 is formed of an oxide, the oxides may be distributed in an island shape apart from each other, and may be formed in a film form in at least one area. Here, an oxide in a particulate state or a molten state, for example, may use at least one of $Bi_2O_3$, $BO_2$, $B_2O_3$, $ZnO$, $Co_3O_4$, $SiO_2$, $Al_2O_3$, $MnO$, $H_2BO_3$, $H_2BO_3$, $Ca(CO_3)_2$, $Ca(NO_3)_2$, and $CaCO_3$.

As described above, according to an embodiment of the present inventive concept, a plurality of coil patterns 200 are formed in a laminate body 1000 in which a plurality of sheets 100 are laminated, and at least two coil patterns 200 are connected to each other to form one noise filter part 2000, and at least three such noise filter parts 2000 are implemented in the laminate body 1000. In addition, a plurality of noise filter parts 2000 are connected to a plurality of external electrodes 3000 formed outside the laminate body 1000 and provided between the signal lines. Therefore, it is possible to eliminate the common mode noise that occurs simultaneously in three signal lines and the common mode noise that occurs between the two signal lines, and accordingly, it may be applicable to the C-PHY.

Also, the number of connections of at least one coil pattern 200 among the plurality of noise filter parts 2000 may be greater than the number of connections of the coil pattern 200 of the remaining noise filter parts 2000. For example, the first noise filter part 2100 may be formed by connecting three coil patterns 210, 240, and 270, and the second and third noise filter parts 2200 and 2300 may be formed by connecting two coil patterns. As the number of connections of the coil patterns connected to the first noise filter part 2100 is larger than the number of connections of the coil patterns of the second and third noise filter parts 2200 and 2300, the impedance of the laminated device may be controlled. That is, as at least one noise filter part 2100 further includes an impedance adjustment coil pattern, the impedance may be improved compared to a structure without an impedance adjustment coil pattern.

Figure 7:
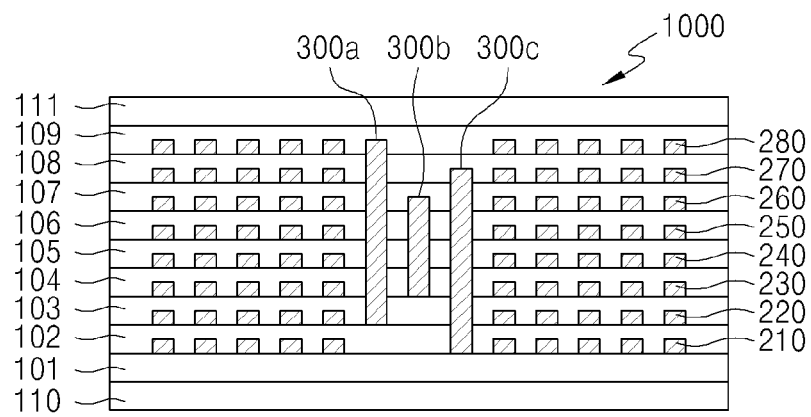
FIGS. 7 and 8 are cross-sectional views of a laminated device according to second embodiments of the present inventive concept.
Figure 8:
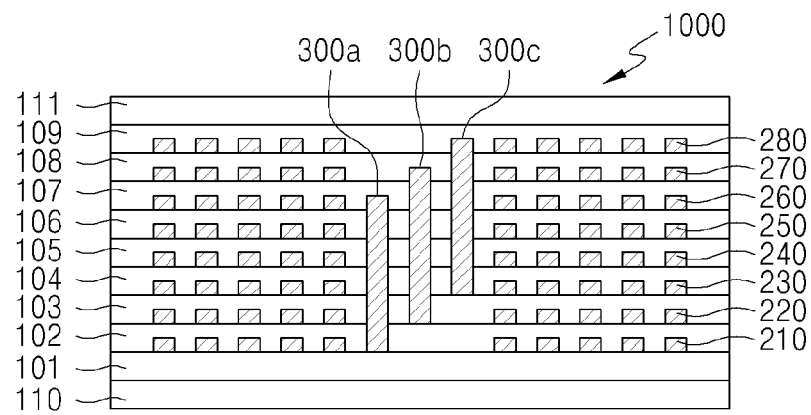
Figure 9:
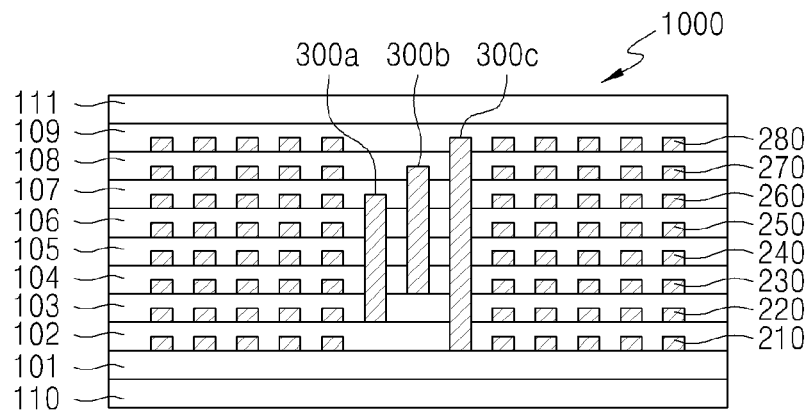
FIGS. 9 and 10 are cross-sectional views of a laminated device according to third embodiments of the present inventive concept.
Figure 10:
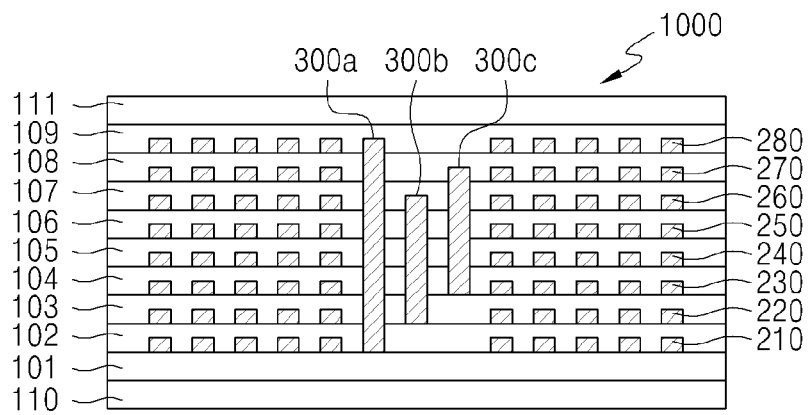
Figure 11:
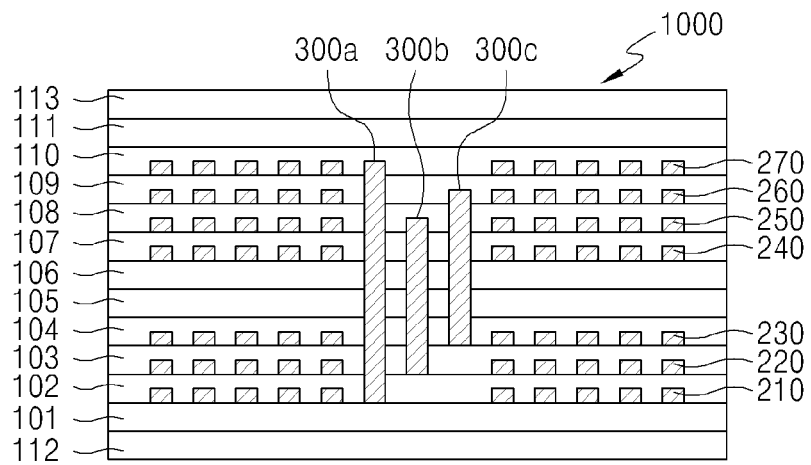
FIGS. 11 and 12 are cross-sectional views of a laminated device according to fourth and fifth embodiments of the present inventive concept.
Figure 12:
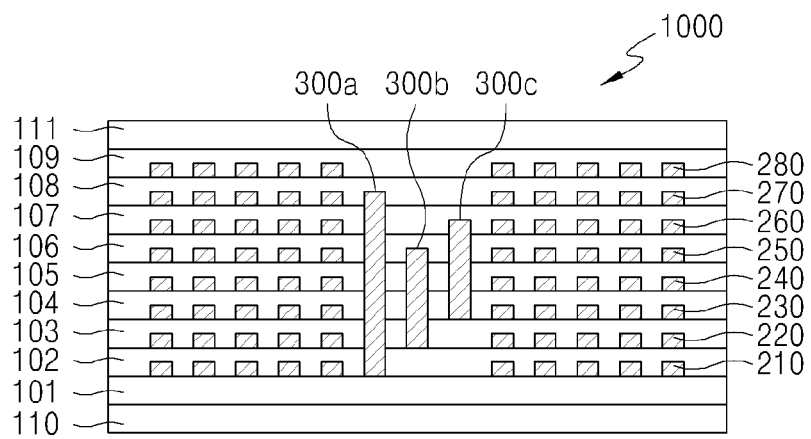

On the other hand, according to the present inventive concept, the connection method of the coil patterns spaced apart from each other may be variously modified. A modification of this connection method will be described with reference to FIGS. 5 to 10 as follows. Here, FIGS. 5 and 6 are cross-sectional views of a modification of a first embodiment of the present inventive concept. FIGS. 7 and 8 are cross-sectional views of a second embodiment of the present inventive concept. FIGS. 9 and 10 are cross-sectional views of a third embodiment of the present inventive concept. Furthermore, FIGS. 11 and 12 are cross-sectional views according to fourth and fifth embodiments of the present inventive concept.

As shown in FIG. 5, the third and fourth coil patterns 230 and 240 may be connected through a vertical connection wiring 300a to form a first noise filter part 2100. The second, fifth and seventh coil patterns 220, 250 and 270 may be connected through a vertical connection wiring 300b to form a second noise filter part 2200. The first and sixth coil patterns 210 and 260 may be connected through a vertical connection wiring 300c to form a third noise filter part 2300. Moreover, as shown in FIG. 6, the third and fourth coil patterns 230 and 240 may be connected through the vertical connection wiring 300a to form the first noise filter part 2100. The second and fifth coil patterns 220 and 250 may be connected through the vertical connection wiring 300b to form the second noise filter part 2200. The first, sixth, and seventh coil patterns 210, 260, and 270 may be connected through the vertical connection wiring 300c to form the third noise filter part 2300.

In the second embodiment, two noise filter parts 2000 may be connected to three coil patterns 200, and one noise filter part 2000 may be connected to two coil patterns 200. That is, the two noise filter parts 2000 include the impedance adjustment coil patterns, so that the plurality of coil patterns 200 may be connected. For example, as shown in FIG. 7, the first to eighth coil patterns 200 (210 to 280) are laminated, and second, fifth and eighth coil patterns 220, 250 and 280 may be connected through the vertical connection wiring 300a to form the first noise filter part 2100. The third and sixth coil patterns 230 and 260 may be connected through the vertical connection wiring 300b to form the second noise filter part 2200. The first, fourth, and seventh coil patterns 210, 240, and 270 may be connected through the vertical connection wiring 300c to form the third noise filter part 2300. Here, the coil patterns formed on the outermost layer, that is, the first and eighth coil patterns 210 and 280, constitute the first and third noise filter parts 2100 and 2300 as impedance adjustment coil patterns, respectively. Also, as shown in FIG. 8, the first to eighth coil patterns 200 (210 to 280) are laminated. The first, fourth and sixth coil patterns 210, 240 and 260 may be connected through a vertical connection wiring 300a to form a first noise filter part 2100. The second and seventh coil patterns 220 and 270 may be connected through the vertical connection wiring 300b to form a second noise filter part 2200. The third, fifth and eighth coil patterns 230, 250 and 280 may be connected through a vertical connection wiring 300c to form a third noise filter part 2300. Here, the coil patterns formed on the outermost layer, that is, the first and eighth coil patterns 210 and 280, constitute the first and third noise filter parts 2100 and 2300 as impedance adjustment coil patterns, respectively.

In the third embodiment, one noise filter part 2000 may be connected to four coil patterns 200, and two noise filter part 2000 may be connected to two coil patterns 200. That is, one noise filter parts 2000 include two impedance adjustment coil patterns, so that the plurality of coil patterns 200 may be connected. For example, as shown in FIG. 9, the first to eighth coil patterns 200 (210 to 280) are laminated. The second and sixth coil patterns 220 and 260 may be connected through the vertical connection wiring 300a to form the first noise filter part 2100. The third and seventh coil patterns 230 and 270 may be connected through the vertical connection wiring 300b to form a second noise filter part 2200. The first, fourth, fifth, and eighth coil patterns 210, 240, 250, and 280 may be connected through a vertical connection wiring 300c to form a third noise filter part 2300. Here, the coil patterns formed on the outermost layer, that is, the first and eighth coil patterns 210 and 280, constitute the third noise filter part 2300 as impedance adjustment coil patterns. Also, as shown in FIG. 10, the first to eighth coil patterns 200 (210 to 280) are laminated. the first, fourth, fifth, and eighth coil patterns 210, 240, 250, and 280 may be connected through a vertical connection wiring 300a to form a first noise filter part 2100. The second and sixth coil patterns 220 and 260 may be connected through the vertical connection wiring 300b to form a second noise filter part 2200. The third and seventh coil patterns 230 and 270 may be connected through the vertical connection wiring 300c to form a third noise filter part 2300. Here, the coil patterns formed on the outermost layer, that is, the first and eighth coil patterns 210 and 280, constitute the first noise filter part 2100 as impedance adjustment coil patterns.

Meanwhile, when the interval between the coil patterns of the lower side forming the first to third noise filter parts 2100, 2200, and 2300 and the interval between the coil patterns of the upper side are the same, the impedance may be adjusted by adjusting the interval between the lower side coil patterns and the upper side coil patterns. Meanwhile, when the interval between the coil patterns of the lower side forming the first to third noise filter parts 2100, 2200, and 2300 and the interval between the coil patterns of the upper side are the same, the impedance may be adjusted according to the interval between the lower side coil patterns and the upper side coil patterns. At this time, the interval between the lower side coil patterns 210, 220, and 230 and the upper side coil patterns 240, 250, 260, and 270 may be, for example, 10 μm to 300 μm, and may be larger or smaller than the interval between the remaining coil patterns. For example, as shown in FIG. 11, the interval between the lower side coil pattern and the upper side coil pattern may be larger than the interval between the remaining coil patterns. At this time, the interval between the lower side coil pattern and the upper side coil pattern may be adjusted by at least one of the number of inserted sheets and the thickness. That is, when a sheet of the same thickness is used, one sheet is provided between the coil patterns, and more than two sheets 105 and 106 may be provided between the third and fourth coil patterns 230 and 240. By thus providing two or more sheets between the lower part coil patterns and the upper part coil patterns, the contact of the via filling conductor may be stabilized. Further, in order to increase the thickness between the third and fourth coil patterns 230 and 240, a sheet thicker than the remaining sheets may be provided therebetween. As the interval between the lower side coil pattern and the upper side coil pattern becomes longer, that is, the interval between the third coil pattern 230 and the fourth coil pattern 240 becomes longer, the interference between the coil pattern group, that is, the lower side coil patterns and the upper side coil patterns, is weakened, and a more stable impedance may be realized. However, if the interval between the third coil pattern 230 and the fourth coil pattern 240 is too far away, the hole filled with the conductive material, that is, the length of the vertical connection wiring, may become long, so that the impedance may be unstable. Therefore, in order to enable stable impedance implementation, the interval between the group of coil patterns may be 10 μm to 300 μm.

As described above, in the embodiments of the present inventive concept, at least one noise filter part has a different number of coil patterns than the other noise filter parts. That is, at least one noise filter part includes at least one impedance adjustment coil pattern compared to the other noise filter part. As at least one impedance adjustment coil pattern is connected to at least one coil pattern through a vertical connection wiring, at least one noise filter part may be implemented by further including at least one coil pattern as compared to the remaining noise filter parts. But, in the embodiment of the present inventive concept, as shown in FIG. 12, at least one coil pattern may not be connected to another coil pattern through a vertical connection wiring, and may not be connected to an external electrode. That is, at least one coil pattern 280 in a floating state may be provided in the laminate body of the present inventive concept. By providing the floating coil pattern in this manner, it is possible to uniformly spread the heat during the firing process. That is, as floating coil pattern is formed at a position where the coil pattern connected to the external electrode is not formed, for example, the floating coil pattern is formed on the outer side of the uppermost or lowermost coil pattern, when heat is applied to the laminate body to perform the firing process, heat may be spread evenly over the laminate body. Therefore, warpage of the element may be prevented, and various physical properties may be improved, for example, implementing uniform physical properties.

Figure 13:
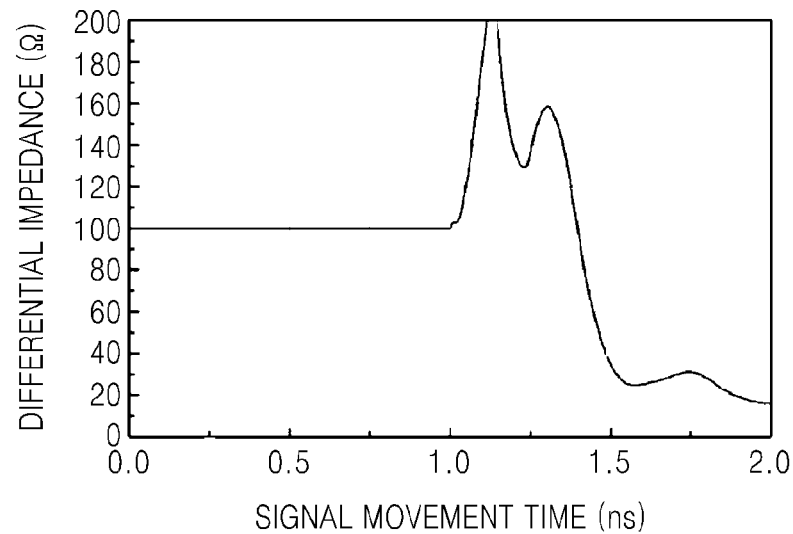
FIGS. 13 and 14 are graphs of impedance characteristics of a laminated device according to a conventional example and a first embodiment of the present inventive concept.
Figure 14:
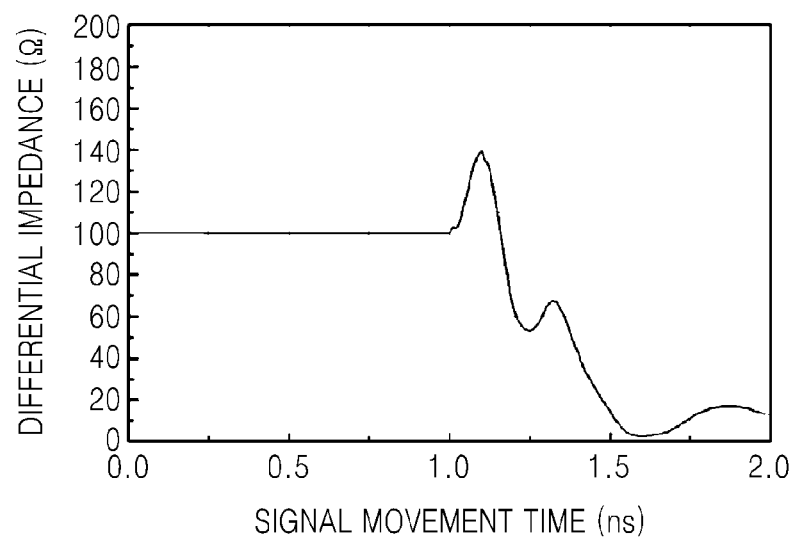

FIG. 13 is a graph showing impedance characteristics of a laminated device according to the prior art. FIG. 14 is a graph showing impedance characteristics of the laminated device according to a first embodiment of the present invention. FIG. 13 shows impedance characteristics of a conventional laminated device without an impedance adjustment coil pattern. Referring to FIGS. 2 and 3, it is an impedance characteristic graph when it is consisted of the first to sixth coil patterns 210 to 260 without the seventh coil pattern 270 so that the first and fourth coil patterns 210 and 240 are connected to form a first noise filter part 2100, the second and fifth coil patterns 220 and 250 are connected to form a second noise filter part 2200, and the third and sixth coil patterns 230 and 260 are connected to form a third noise filter part 2300. On the other hand, FIG. 14 is a graph of impedance characteristics of a laminated device provided with one impedance adjustment coil pattern according to a first embodiment of the present invention described with reference to FIG. 2A and FIG. 3. As shown in FIG. 13, in relation to a conventional laminated device without an impedance adjustment coil pattern, the variation of the differential impedance is large. However, as shown in FIG. 14, in relation to a laminated device according to an embodiment of the present invention having an impedance adjustment coil pattern, the variation of the differential impedance is smaller than that in the conventional example. That is, the laminated device according to the prior art changes up to 200Ω depending on the movement time of the signal based on the desired impedance of 100Ω. However, the laminated device according to the embodiment of the present invention changes to 140Ω depending on the movement time of the signal based on 100Ω. Accordingly, the laminated device according to the present invention may uniformly adjust the desired impedance to the laminated device according to the conventional art.

Figure 15:
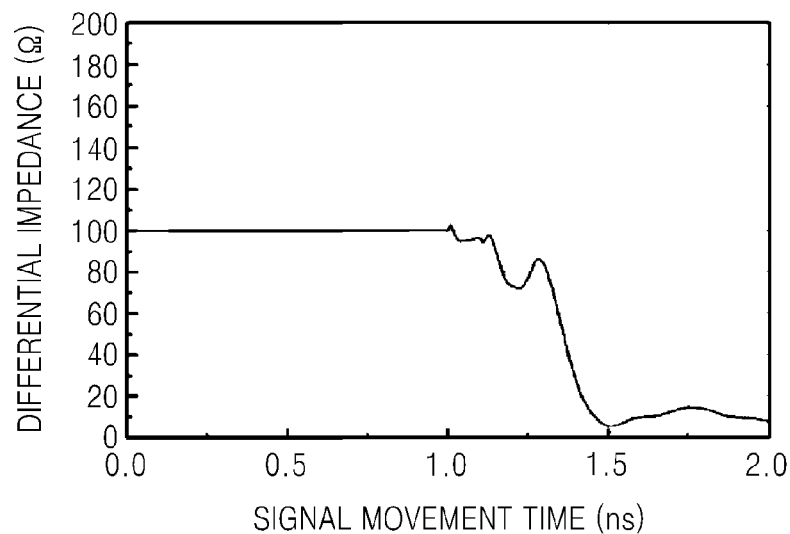
FIGS. 15 and 16 are impedance graphs of a laminated device according to second embodiments of the present inventive concept.
Figure 16:
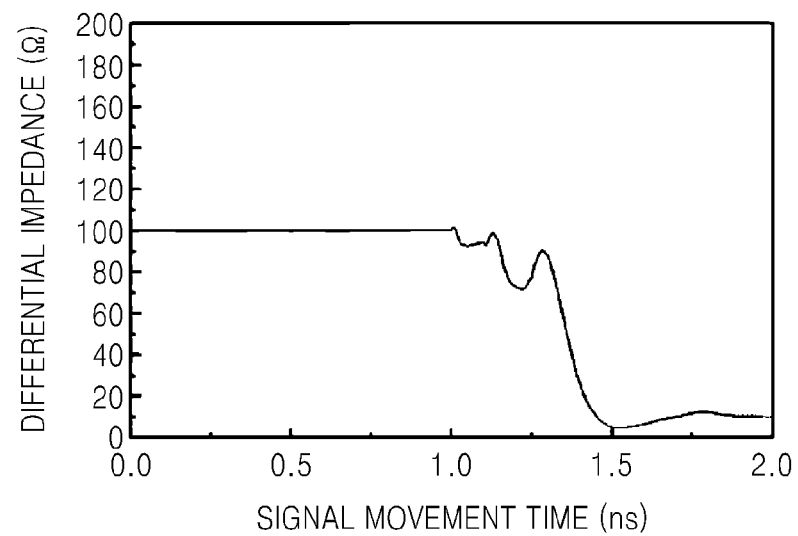
Figure 17:
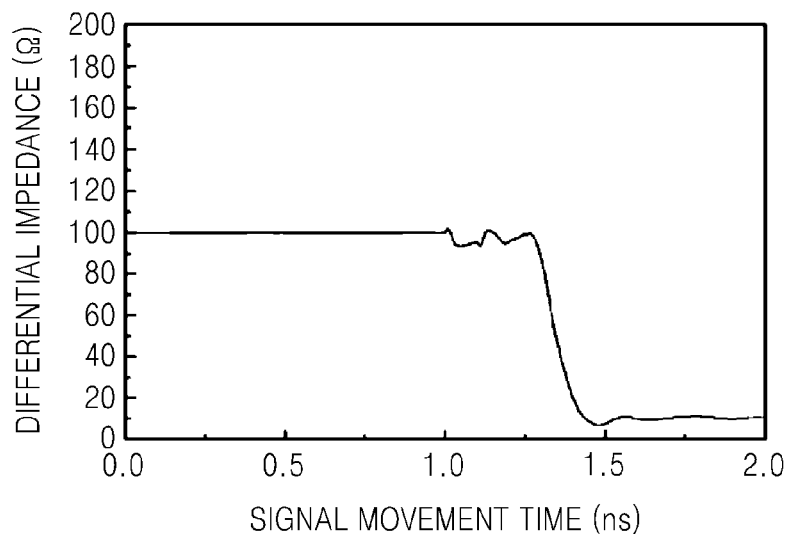
FIGS. 17 and 18 are impedance graphs of a laminated device according to third embodiments of the present inventive concept.
Figure 18:
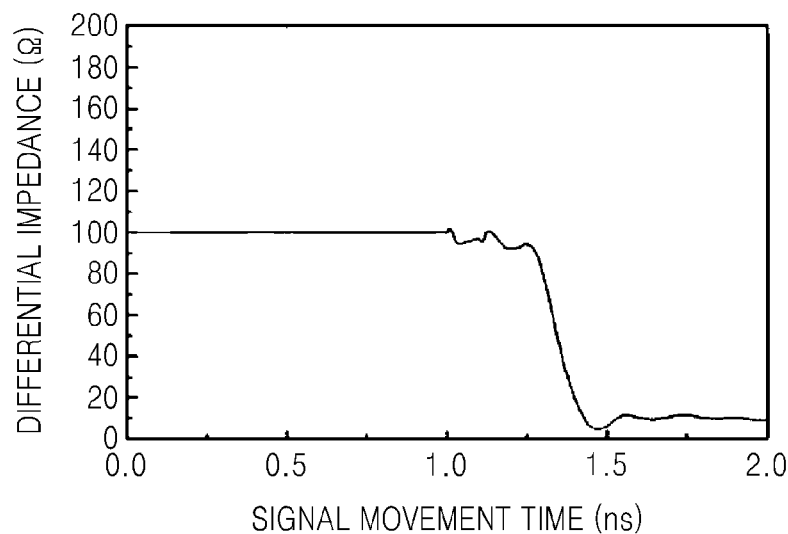

FIGS. 15 to 18 are graphs of impedance characteristics according to the second and third embodiments of the present inventive concept. Here, FIGS. 15 and 16 are graphs of impedance characteristics of the laminated device according to the second embodiment of the present inventive concept described with reference to FIGS. 7 and 8, respectively, and FIGS. 17 and 18 are graphs of impedance characteristics of the laminated device according to the third embodiment of the present inventive concept described with reference to FIGS. 9 and 10, respectively. That is, FIGS. 15 and 16 are graphs of impedance characteristics of a laminated device in which two noise filter parts have impedance adjustment coil patterns, and FIGS. 17 and 18 are graphs of impedance characteristics of a laminated device in which one noise filter part has two impedance adjustment coil patterns.

As shown in FIGS. 15 and 16, when two noise filter parts have one impedance adjustment coil pattern, the change of the impedance may be further reduced compared with the case where one noise filter part shown in FIG. 14 has one impedance adjustment coil pattern. That is, when two noise filter parts have one impedance adjustment coil pattern, the impedance is almost maintained at 100Ω, but as shown in FIG. 14, when one noise filter part includes one impedance adjustment coil pattern, the impedance is changed from 100Ω to 140Ω. Further, as shown in FIGS. 15 and 16, when adjusting the connection of the impedance adjustment coil pattern, the impedance may be finely adjusted.

Then, as shown in FIGS. 17 and 18, if one noise filter part has two impedance adjustment coil patterns, it is possible to further reduce the change of the impedance as compared with FIG. 14, and it is possible to reduce the change of the impedance as compared with FIGS. 15 and 16. Further, as shown in FIGS. 17 and 18, when adjusting the connection of the impedance adjustment coil pattern, the impedance may be finely adjusted.

As described above, the embodiments of the present inventive concept may realize various impedance characteristics according to the number of impedance adjustment coil patterns, the number of noise filter parts connected to the impedance adjustment coil pattern, the connection relation of the impedance adjustment coil pattern, and the like. Therefore, various impedances may be realized by changing the impedance adjustment coil pattern, and accordingly, a laminated device that may be mounted on various electronic devices with various impedances may be realized with fewer design changes.

Figure 19:
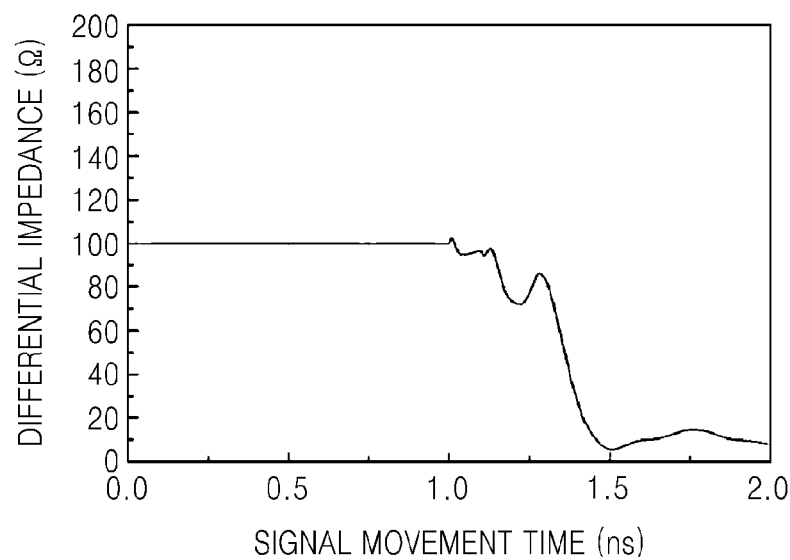
FIGS. 19 to 21 are impedance graphs according to the number of revolutions of the impedance adjustment coil pattern according to the embodiments of the present inventive concept.
Figure 20:
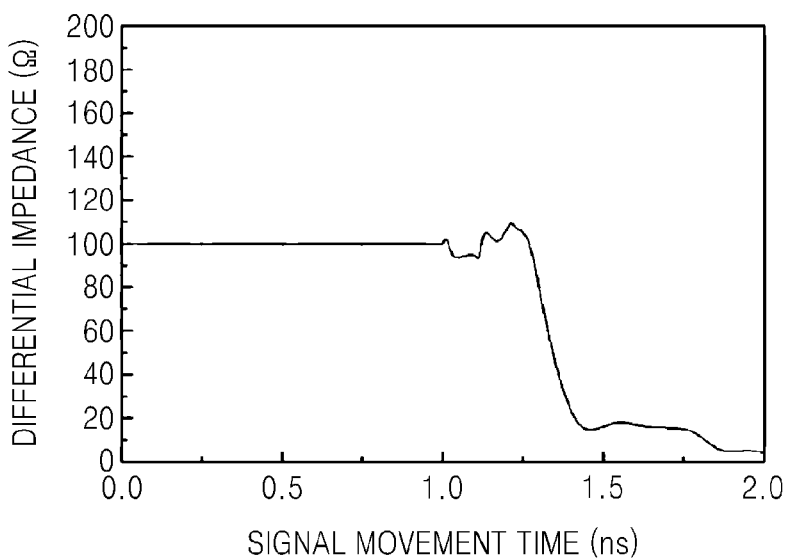
Figure 21:
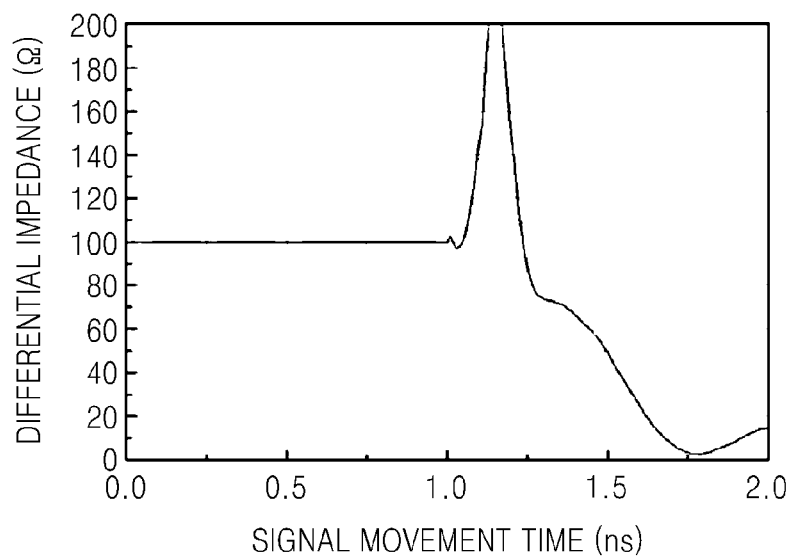

Meanwhile, the laminated device according to the embodiments of the present inventive concept may adjust the impedance according to the number of revolutions of the impedance adjustment coil pattern. Impedance characteristics according to the number of revolutions of the impedance adjustment coil pattern are shown in FIGS. 19 to 21. FIG. 19 is a graph of impedance characteristics when the impedance adjustment coil pattern and the remaining coil pattern are formed of the same number of revolutions, and FIGS. 20 and 21 are graphs of impedance characteristics when the number of revolutions of the impedance adjustment coil pattern is smaller than the number of revolutions of the remaining coil pattern. Here, the number of revolutions of the impedance adjustment coil pattern was 5, 3 and 2, and the number of revolutions of the remaining coil patterns was 5. As compared to the case where the number of revolutions of the impedance adjustment coil pattern is equal to the number of revolutions of the remaining coil pattern as shown in FIG. 19, as the number of revolutions of the impedance coil pattern decreases as shown in FIGS. 20 and 21, the impedance may be increased. In other words, if the number of revolutions of the impedance control coil pattern is 3, the impedance is slightly changed as compared with the five times, but when the number of revolutions is 2, the impedance changes greatly. The reason for the change in the impedance of the laminated device is due to the mismatch between the remaining coil pattern and the impedance adjustment coil pattern disposed in parallel. Therefore, as the number of revolutions of the impedance adjustment coil pattern is reduced, the impedance increases. That is, as the impedance mismatch section of the impedance adjustment coil pattern and the remaining coil pattern becomes longer, that is, the number of revolutions of the impedance adjustment coil pattern decreases, the impedance rapidly changes.

Figure 22:
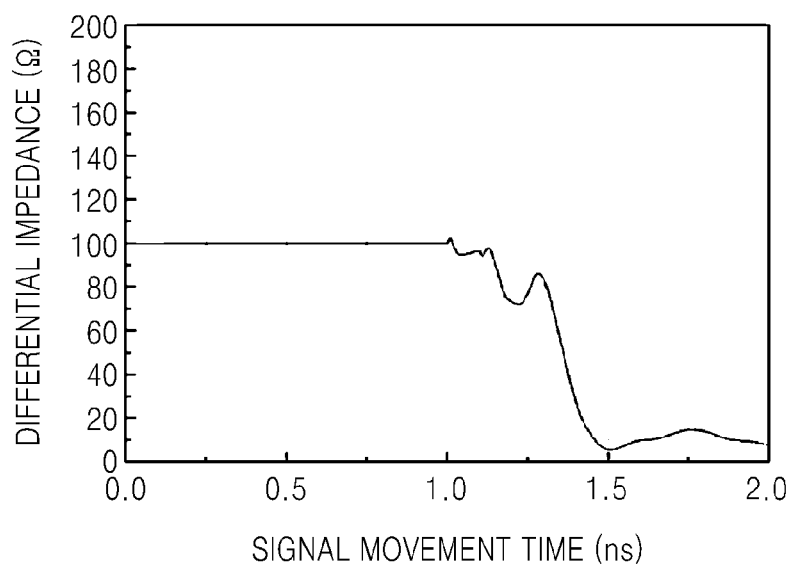
FIGS. 22 to 24 are graphs of impedance according to the impedance adjustment coil pattern and the interval between adjacent coil patterns according to the embodiments of the present inventive concept.
Figure 23:
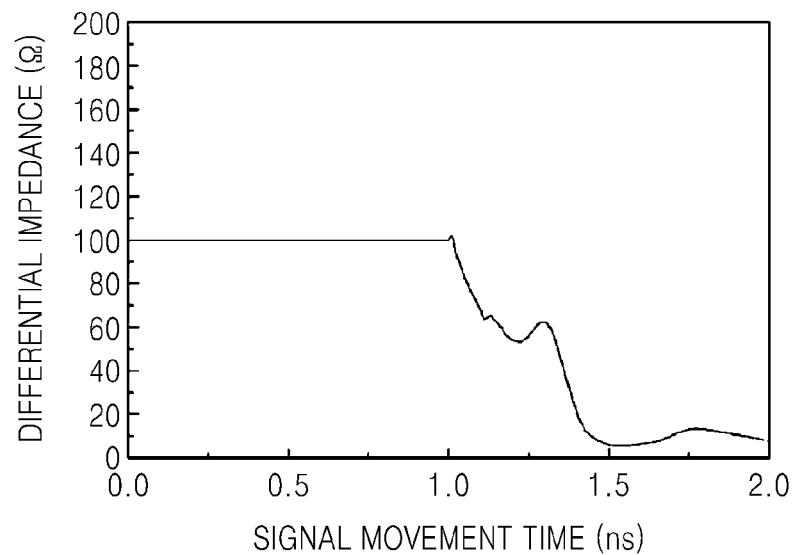
Figure 24:
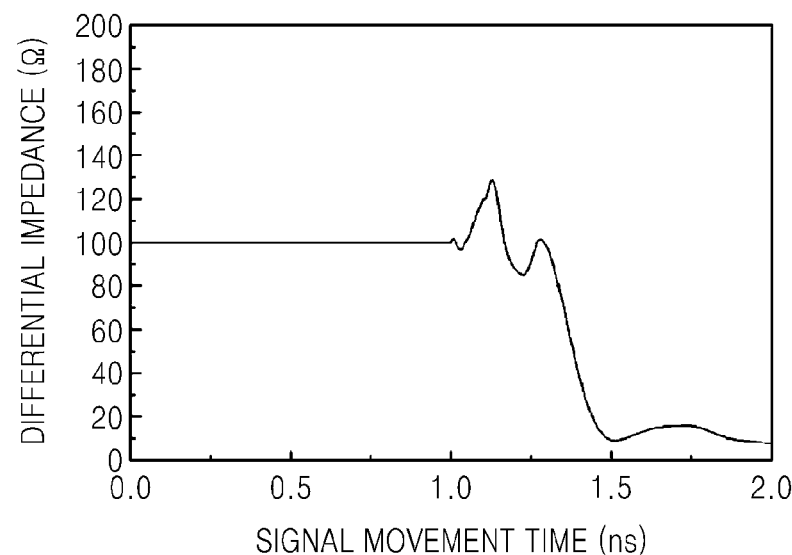

In addition, according to the interval between the impedance adjustment coil pattern and the adjacent coil pattern, the impedance of the laminated device may be adjusted. FIGS. 22 to 24 show graphs of impedance characteristics according to the interval between the impedance adjustment coil pattern and the adjacent coil pattern. FIG. 22 is a graph of an impedance characteristic when the interval between the impedance adjustment coil pattern and the remaining coil pattern is the same. FIG. 23 is an impedance characteristic graph when the interval between the impedance adjustment coil pattern and the coil pattern adjacent thereto is narrower than ½ of the interval between the remaining coil patterns. FIG. 24 is a graph of impedance characteristics when the interval between the impedance adjustment coil pattern and the adjacent coil pattern is two times wider than the interval between the remaining coil patterns. As compared to the interval between the impedance adjustment coil pattern and the remaining coil pattern is the same as shown in FIG. 22, when the interval between the impedance coil pattern and the adjacent coil pattern is narrow as shown in FIG. 23, the coupling between the coil patterns increases and the impedance decreases. That is, the change of the impedance is small. However, as shown in FIG. 24, when the interval between the impedance adjustment coil pattern and the adjacent coil pattern is wide, the coupling between the coil patterns is reduced so that the impedance is increased. That is, the change of the impedance is large.

As described above, the laminated device of the present inventive concept may control impedance variously according to the number of revolutions of the impedance adjustment coil pattern and the interval between the impedance adjustment coil pattern and the adjacent coil pattern. Therefore, various impedances may be realized by changing the impedance adjustment coil pattern, and accordingly, a laminated device that may be mounted on various electronic devices with various impedances may be realized with fewer design changes.

Figure 25:
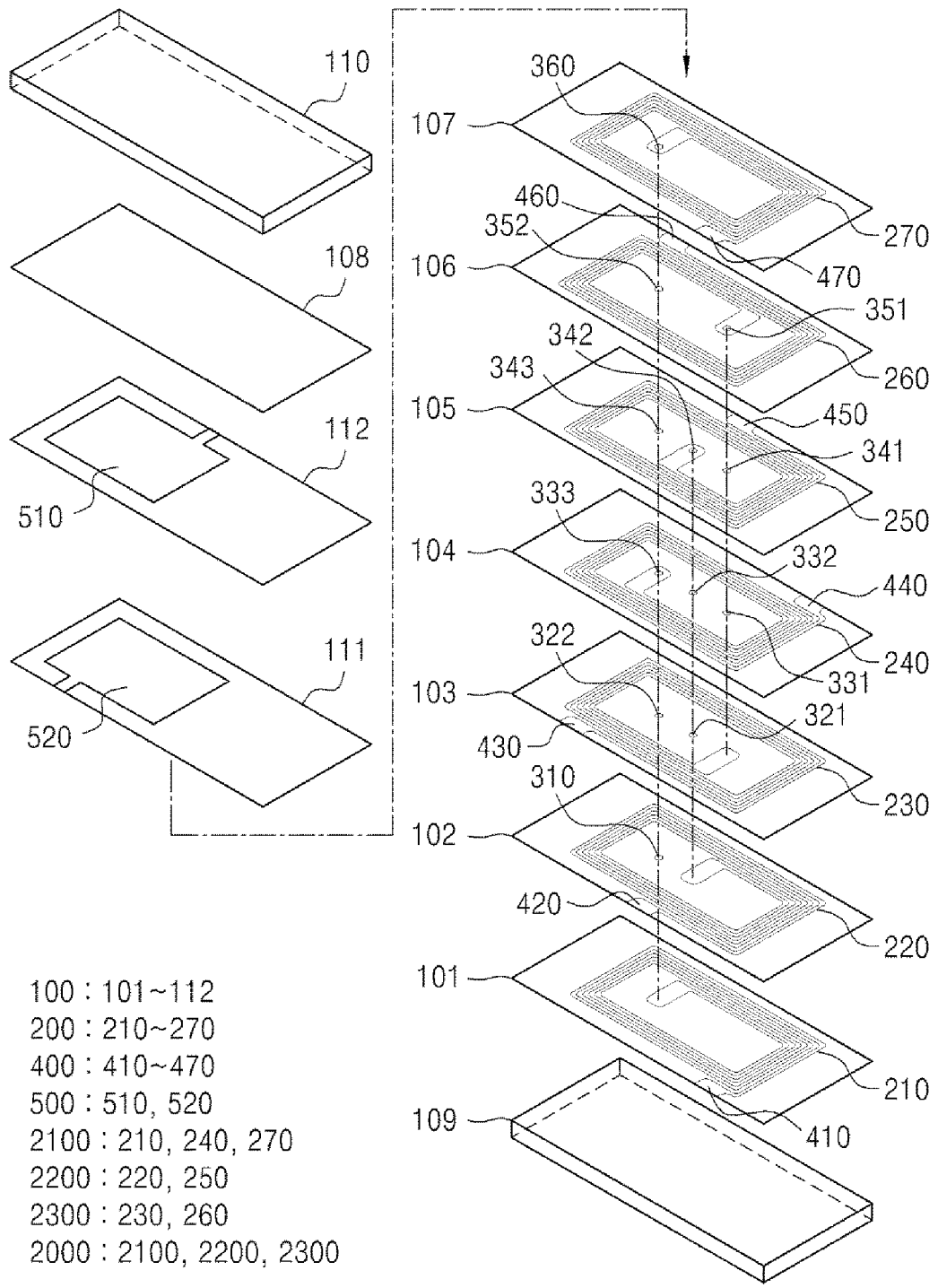
FIGS. 25 to 27 are views for explaining a laminated device according to a sixth embodiment of the present inventive concept.
Figure 26:
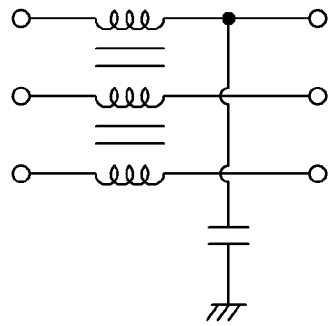
Figure 27:
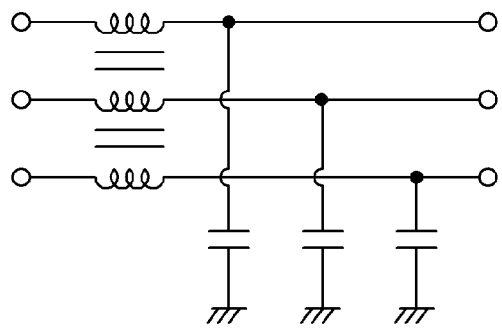

FIG. 25 is an exploded perspective view of a laminated device according to a sixth embodiment of the present inventive concept, and FIG. 26 is a circuit diagram. In addition, FIG. 27 is a circuit diagram according to a modification of the sixth embodiment of the present inventive concept. In the sixth embodiment of the present inventive concept, a capacitor including at least one internal electrode is formed between at least one area of the plurality of noise filter parts 2000. That is, in the sixth embodiment of the present inventive concept, at least one capacitor may be provided in the laminated device. As shown in FIGS. 25 and 26, a capacitor may be formed in one noise filter part 2000. As shown in FIG. 27, a plurality of capacitors may be formed in the plurality of noise filter parts 2000.

Referring to FIGS. 25 to 27, the laminated device according to the sixth embodiment of the present inventive concept includes a laminate body 1000 in which a plurality of sheets 100 are laminated, at least three noise filter parts 2000 (2100, 2200, and 2300) provided in the laminate body 1000 and each including a plurality of coil patterns 200, external electrodes 3000 (3100 and 3200) formed on two side surfaces facing each other of the laminate body 1000 and connected to the noise filter part 2000, and at least one internal electrode 500 (510 and 520) provided in a predetermined area in the laminate body 1000. Here, at least one of the plurality of noise filter parts 2000 includes at least one impedance adjustment coil pattern 270.

That is, in relation to the laminated device according to the sixth embodiment of the present inventive concept, at least two internal electrodes 510 and 520 are provided in the laminate body 1000 so as to overlap partially so that at least one capacitor is formed therebetween. For example, two sheets 111 and 112 are provided between the seventh sheet 107 and the eighth sheet 108, and internal electrodes 510 and 520 of a predetermined shape are formed to at least partially overlap on each of the sheets 111 and 112, so that a capacitor is formed. That is, the capacitors are formed by the first and second internal electrodes 510 and 520 and the twelfth sheet 112 formed therebetween. Here, at least two internal electrodes 510 and 520 may be connected to at least one of the first and second external electrodes 3100 and 3200 formed on the two side surfaces facing each other of the laminate body 1000. For example, the first internal electrode 510 may be connected to the 1-3 external electrode 3130 and the second internal electrode 520 may be connected to the 2-2 second external electrode 3220. At this time, at least one of the external electrodes 3000 may be connected to the ground terminal, and for example, the 1-3 external electrode 3130 may be connected to the ground terminal. On the other hand, in order for at least one of the first and second internal electrodes 510, 520 to be connected to the ground terminal, a third external electrode (not shown) may be formed outside the laminate body 1000. That is, at least one of the first and second internal electrodes 510 and 520 may be connected to the third external electrode without being connected to the first and second external electrodes 3100 and 3200. At this time, the third external electrode may be formed on two surfaces facing each other of the laminate body 1000 where the first and second external electrodes 3100 and 3200 are not formed, and may be connected to the ground terminal. Thus, in this case, either one of the first and second internal electrodes 510, 520 may be connected to the ground terminal through the third external electrode. On the other hand, the capacitor may be formed between the coil patterns 200. For example, although not shown in the drawing, a capacitor may be formed between the third coil pattern 230 and the fourth coil pattern 240. For this, at least one sheet is further provided between the third and fourth sheets 130 and 140 where the third and fourth coil patterns 230 and 240 are respectively formed, and at least one internal electrode may be formed on at least one sheet to realize a capacitor. For example, sheets 111 and 112 where an internal electrode 500 is formed between the third and fourth sheets 130 and 140 may be provided to form a capacitor. In addition, one sheet where one internal electrode is formed may be provided between the coil patterns 200. At this time, if one sheet is further provided and one internal electrode is formed, a capacitor may be formed between the internal electrode and the coil pattern of its upper part, and the internal electrode and the coil pattern of its lower part. That is, a capacitor may be formed between adjacent coil patterns with the internal electrode and the sheet therebetween. Of course, at least two internal electrodes 500 may be formed in at least two areas between the coil patterns 200, so that at least two capacitors may be formed in the laminate body 1000. At this time, the internal electrode 500 for forming the capacitor may be formed in various shapes. In order to connect the coil patterns 200 to each other, a hole filled with a conductive material should also be formed in the sheet where the internal electrode 500 is formed, and the internal electrode 500 may be formed spaced a predetermined interval from the hole filled with the conductive material. Thus, at least one capacitor is formed in the laminate body 1000, and for example, as shown in FIG. 27, a capacitor may be formed in each noise filter.

As described above, according to the sixth embodiment of the present inventive concept, by adjusting the number of revolutions of the coil pattern 200, the area of the internal electrode 500 of the capacitor, and the interval between the coil patterns 200, that is, the thickness of the sheets 102 to 107, the inductance and the capacitance may be adjusted so that the noise of the frequency that may be suppressed may be adjusted. For example, when the thickness of the sheets 102 to 107 is reduced, noise in a low frequency band may be suppressed, and when the thickness is increased, noise in a high frequency band may be suppressed. The laminated device including three noise filter parts 2000 and one or more capacitors, that is, the common mode noise filter, may suppress noise of at least two frequency bands. Therefore, the laminated device according to the sixth embodiment of the present inventive concept may suppress noise in two or more frequency bands, and accordingly, it may be used in portable electronic devices such as smart phones employing various frequency functions, thereby improving the quality of electronic devices.

Figure 28:
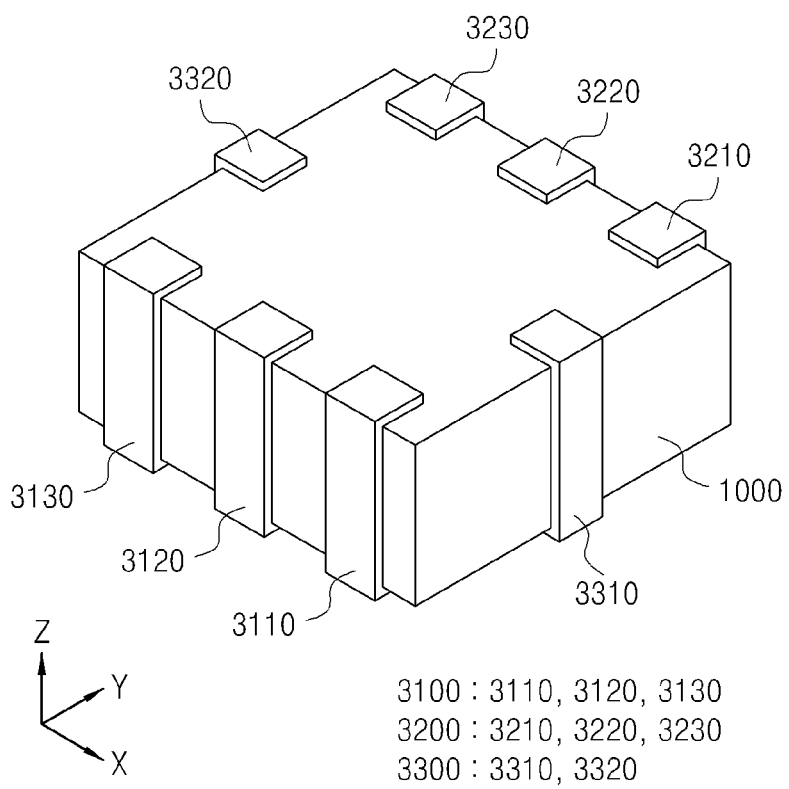
FIGS. 28 and 29 are views for explaining a laminated device according to a seventh embodiment of the present inventive concept.

Meanwhile, the laminated device according to the present inventive concept may be provided with a structure in which a plurality of noise filter parts 2000 and an overvoltage protection unit for protecting electronic devices from overvoltage of ESD and the like are combined. That is, at least three or more noise filters 2000 and an overvoltage protection unit may be combined to realize a laminated device. A laminated device according to a seventh embodiment of the present inventive concept will now be described with reference to FIGS. 28 and 29. FIG. 28 is a perspective view of a laminated device according to a seventh embodiment of the present inventive concept, and FIG. 29 is an exploded perspective view.

Figure 29:
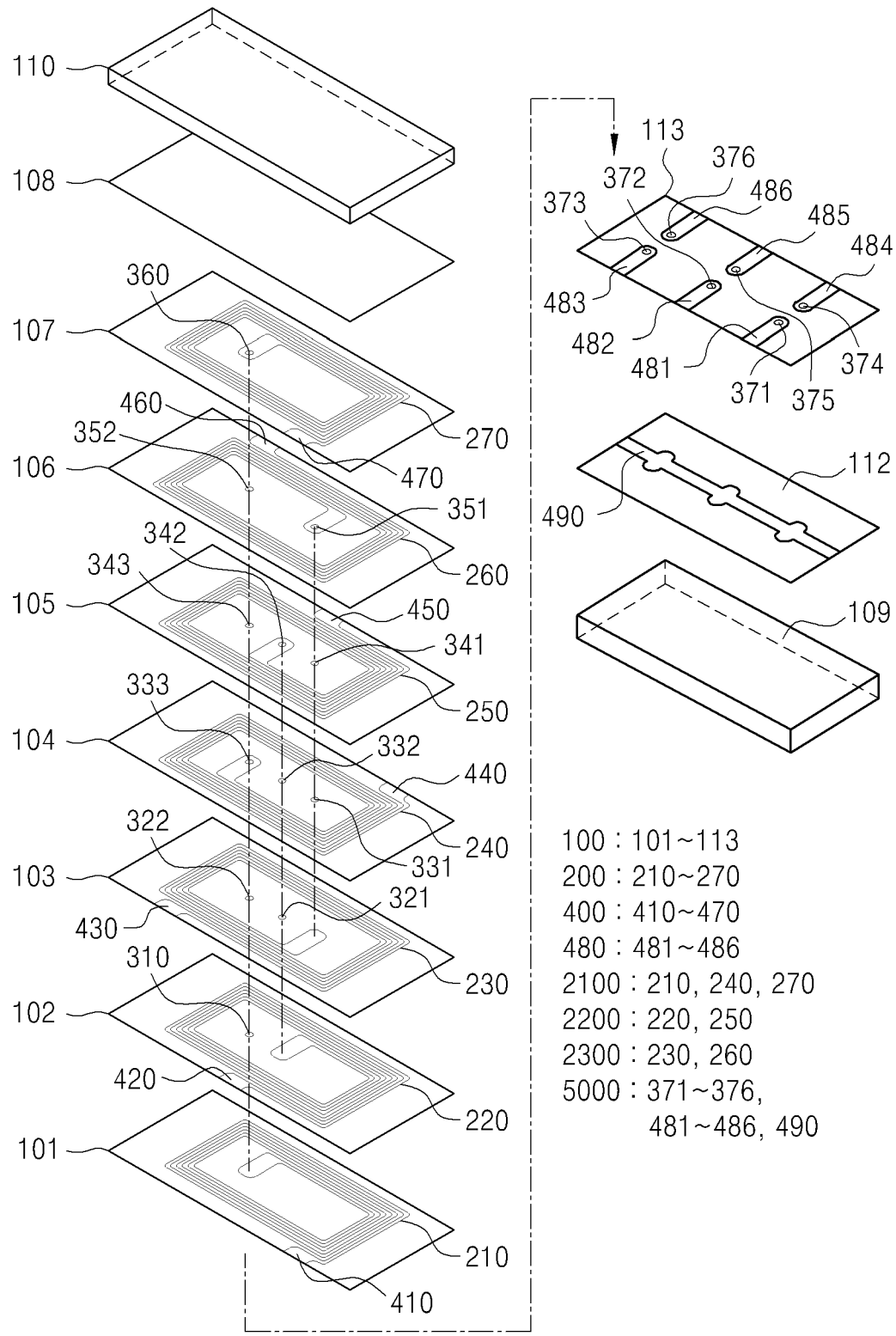

Referring to FIGS. 28 and 29, the laminated device according to the seventh embodiment of the present inventive concept may include at least three noise filter parts 2000 (2100, 2200, and 2300) each including a plurality of coil patterns 200, first and second external electrodes 3100 and 3200 formed on two side surfaces facing each other of the laminate body 1000 and connected to at least three noise filter parts 2000, an overvoltage protection unit 5000 provided in the laminate body 1000, and a third external electrode 3300 formed on two side surfaces facing each other of the laminate body 1000 being spaced from the first and second external electrodes 3100 and 3200 and connected to the overvoltage protection unit 5000. Here, the third external electrode 3300 may be formed on the side surface of the laminate body 1000 where the first and second external electrodes 3100 and 3200 are not formed. For example, first and second external electrodes 3100 and 3200 are formed on two side surfaces facing each other in the Y direction of the laminate body 1000, and a third external electrode 3300 may be formed on the two side surfaces facing in the X direction of the laminate body 1000. That is, in relation to the laminated device according to another embodiment of the present inventive concept, at least three noise filter parts 2000 including a plurality of coil patterns 200 are connected to the first and second external electrodes 3100 and 3200, and an overvoltage protection unit 5000 is provided inside the laminate body 1000 being spaced apart from the noise filter part (2000) so that it is connected to the third external electrode 3300. On the other hand, although not shown in the drawings, a capacitor including at least one internal electrode described in the sixth embodiment of the present inventive concept may also be applied to the seventh embodiment of the present inventive concept.

The overvoltage protection unit 5000 is configured by laminating at least two sheets 112 and 113 in which the drawing electrodes 481 to 486 and 490 and the holes 371 to 376 are selectively formed. Here, the sheets 112 and 113 may be provided between the first sheet 101 and the ninth sheet 109, that is, between the first sheet 101 and the lower part cover layer. Of course, the sheets 112 and 113 may be provided between the seventh sheet 107 and the eighth sheet 108. The sheets 112 and 113 may be provided in the shape of a rectangular plate having the same thickness and shape as those of the sheets 100 constituting the noise filter part 2000. In addition, the sheets 112 and 113 may be made of a non-magnetic sheet or a magnetic sheet. For example, the sheets 101 to 108 constituting the noise filter part 2000 may be made of a non-magnetic sheet, and the ninth and tenth sheets 109 and 110 used as a lower part and upper part cover layer and the sheets 112 and 113 where the overvoltage protection unit 5000 is configured may be made of a magnetic sheet.

A plurality of drawing electrodes 480 (481 to 486) are formed on the upper surface of the sheet 113. The plurality of drawing electrodes 480 may be formed at the same position as the drawing electrodes 410 to 470 of the plurality of noise filter parts 2000 connected to the first and second external electrodes 3100 and 3200. Thus, the drawing electrode 481 may be connected to the 1-1 external electrode 3110, the drawing electrode 482 may be connected to the 1-2 external electrode 3120, and the drawing electrode 483 may be connected to the 1-3 external electrode 3130. In addition, the drawing electrode 484 may be connected to the 2-1 external electrode 3210, the drawing electrode 485 may be connected to the 2-2 external electrode 3220, and the drawing electrode 486 may be connected to the 2-3 external electrode 3230. Furthermore, a plurality of holes 371 to 376 are formed on the sheet 113. The plurality of holes 371 to 376 may be formed at one ends of the drawing electrodes 481 to 486, respectively. Further, the plurality of holes 371 to 376 are each filled with the overvoltage protection material. The overvoltage protection material may be formed of a material in which at least one conductive material selected from Ru, Pt, Pd, Ag, Au, Ni, Cr, W and Fe is mixed with an organic material such as polyvinyl alcohol (PVA) or polyvinyl butyral (PVB). The overvoltage protection material may be formed by further mixing a varistor material such as ZnO or an insulating ceramic material such as $Al_2O_3$ with the mixed material. Of course, various materials other than the above-mentioned materials may be used as the overvoltage protection material. For example, the overvoltage protection material may use at least one of porous insulating material and void. That is, a porous insulating material may be filled or coated in the hole, a void may be formed in the hole, and a mixed material of a porous insulating material and a conductive material may be filled or coated in the hole. In addition, porous insulating materials, conductive materials and voids may also be formed constituting a layer in the hole. For example, a porous insulating layer may be formed between the conductive layers, and voids may be formed between the insulating layers. At this time, the voids may be formed by connecting a plurality of pores of the insulating layer to each other. Here, a ferroelectric ceramic having a permittivity of about 50 to 50,000 may be used as the porous insulating material. For example, the insulating ceramic may be formed using a mixture of dielectric material powder such as MLCC, ZrO, ZnO, $BaTiO_3$, $Nd_2O_5$, $BaCO_3$, $TiO_2$, Nd, Bi, Zn and $Al_2O_3$. Such a porous insulating material may be formed with a porous structure in which a plurality of pores each having a size of about 1 nm to 5 μm are formed with a porosity of 30% to 80%. At this time, the shortest distance between the pores may be about 1 nm to 5 μm. In addition, the conductive material used as the overvoltage protection material may be formed using conductive ceramics, and the conductive ceramic may use a mixture containing at least one of La, Ni, Co, Cu, Zn, Ru, and Bi. On the other hand, the inside of the plurality of holes 361 to 366 may maintain a vacant space and the vacant space may be used as the overvoltage protection member.

The sheet 112 is provided on the lower side of the sheet 113, and a drawing electrode 490 is formed on the upper part thereof. The drawing electrode 490 may be formed to be exposed from one side of the sheet 112 to the other side opposite thereto. That is, the drawing electrode 490 is formed so as to be exposed to the side orthogonal to the side through which the drawing electrodes 481 to 486 formed on the sheet 113 are exposed. This drawing electrode 490 is connected to a third external electrode 3300 (3310 and 3320) formed on two side surfaces facing each other of the laminate body 1000. In addition, a predetermined area of the drawing electrode 490 is connected to the holes 371 to 376 of the sheet 113. For this, a portion connected to the holes 371 to 376 may be formed to have a width larger than those of other areas.

A sheet (not shown) may be provided on the sheet 113. The sheet not shown is provided to separate the noise filter part 2000 and the overvoltage protection unit 5000, and may be formed to have a thickness that suppresses the interference therebetween. The sheet not shown may be formed by laminating a plurality of sheets having the same thickness as the sheets 112 and 113.

A laminated device in which a plurality of noise filter parts 2000 and an overvoltage protection unit 5000 are combined according to the seventh embodiment of the present inventive concept is connected to the first and second external electrodes 3100 and 3200 between a signal input terminal used in an electronic device and the system and the third external electrode 3300 is connected to the ground terminal. Therefore, common mode noise may be removed, and a high voltage such as static electricity flowing into the input/output terminal may be flowed to the ground terminal. That is, when the overvoltage protection unit 5000 is connected to the ground terminal between the input terminal and the output terminal and a voltage equal to or higher than an undesired predetermined voltage is applied between both ends of the laminated device, a discharge occurs between the conductive particles of the overvoltage protection material, so that current is supplied to the ground terminal, and the voltage difference between the two ends of the laminated device is reduced. For example, the overvoltage protection unit 5000 may exist in a state where the overvoltage protection material filled in the holes 371 to 376 is mixed with the conductive material and the porous insulating material at a predetermined ratio. That is, when the conductive particles are present between the insulating materials and a voltage lower than a predetermined voltage is applied to the drawing electrodes 481 to 486, the insulation state is maintained, and when a voltage higher than a predetermined voltage is applied to the drawing electrodes 481 to 486, a discharge is generated between the conductive particles to reduce the voltage difference between the drawing electrodes 481 to 486. At this time, since both ends of the laminated device are not in the conduction state, the input signal is directly transmitted to the input/output terminal without distortion. That is, when the static electricity occurs, the static electricity exits through the ground through the corresponding laminated device and thus the laminated device protects the circuit at the time, and the signal transmitted and received by the system is maintained as it is.

The present inventive concept is not limited to the above-described embodiments, but may be implemented in various forms. In other words, the above-described embodiments are provided so that the disclosure of the present inventive concept is complete, and are provided to fully disclose the scope of the inventive concept to those skilled in the art. The scope of the present inventive concept should be understood by the appended claims.

INDUSTRIAL APPLICABILITY

An embodiment of the inventive concept provides a laminated device is possible to eliminate the common mode noise that occurs simultaneously in three signal lines and the common mode noise that occurs between the two signal lines.

What is claimed is:

1. A laminated device comprising:
a laminate body where a plurality of sheets are laminated;
a plurality of noise filter parts provided in the laminate body and each having at least one coil pattern; and
a plurality of external electrodes provided outside the laminate body and connected to the plurality of noise filter parts, respectively,
wherein at least one of the plurality of noise filter parts has a number of coil patterns that is different from that of the rest,
wherein less than all of the noise filter parts of the plurality of noise filter parts has at least one impedance adjustment coil pattern, and
wherein the at least one impedance adjustment coil pattern is connected to the at least one coil pattern.

2. The laminated device of claim 1, wherein the at least one impedance adjustment coil pattern is connected to the at least one coil pattern through a vertical connection wiring.

3. The laminated device of claim 2, wherein the impedance adjustment coil pattern is formed on the outermost side of the coil pattern in the lamination direction of the sheet.

4. The laminated device of claim 2, wherein an impedance is adjusted according to at least one of the number of impedance adjustment coil patterns, the number of revolutions, and a line width.

5. The laminated device of claim 4, wherein an impedance is adjusted according to at least one of an interval between the impedance adjustment coil pattern and an adjacent coil pattern and a connection relationship between the impedance adjustment coil pattern and a coil pattern.

6. The laminated device of claim 1, wherein in relation to at least one of the number of coil patterns, at least one of the number of revolutions of a coil pattern, a line width, and an interval between coil patterns is different.

7. The laminated device of claim 6, wherein an impedance is adjusted according to at least one of the number of revolutions of the coil pattern, a line width, and an interval between the coil patterns.

8. The laminated device of claim 1, further comprising a magnetic core formed at the center of at least one coil pattern,
wherein a magnetic material is filled in a central part of the sheet to form the magnetic core, and the magnetic core is surrounded by the at least one coil pattern.

9. The laminated device of claim 1, further comprising at least one of at least one capacitor and overvoltage protection unit provided in the laminate body.

10. The laminated device of claim 9, wherein a sheet where the noise filter part is formed is a non-magnetic sheet, and a sheet where the overvoltage protection unit is formed is a magnetic sheet.

11. The laminated device of claim 1, further comprising a surface modification member formed on at least a part of the surface of the laminate body and made of a material different from the surface of the laminate body.

12. The laminated device of claim 11, wherein the external electrode extends on at least one of the lowermost and uppermost sheets of the laminate body, and the surface modification member is provided between an extended area of at least the external electrode and the laminate body.

13. The laminated device of claim 1, further comprising a floating coil pattern provided in the laminate body and not connected to another coil pattern and not connected to an external electrode.

* * * * *